United States Patent
Lee et al.

(10) Patent No.: US 9,618,816 B2
(45) Date of Patent: Apr. 11, 2017

(54) ARRAY SUBSTRATE FOR LIQUID CRYSTAL DISPLAY DEVICE AND METHOD OF FABRICATING THE SAME

(71) Applicant: LG Display Co., Ltd., Seoul (KR)

(72) Inventors: Sang-Hyup Lee, Gyeongbuk (KR); Jin-Seok Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/706,540

(22) Filed: May 7, 2015

(65) Prior Publication Data

US 2015/0241748 A1    Aug. 27, 2015

Related U.S. Application Data

(62) Division of application No. 14/102,917, filed on Dec. 11, 2013, now Pat. No. 9,069,220, which is a division
(Continued)

(30) Foreign Application Priority Data

Apr. 24, 2008    (KR) ........................ 10-2008-0038195

(51) Int. Cl.
    *G02F 1/13* (2006.01)
    *G02F 1/1362* (2006.01)
    (Continued)

(52) U.S. Cl.
    CPC ...... *G02F 1/136259* (2013.01); *H01L 27/124* (2013.01); *H01L 27/1259* (2013.01);
    (Continued)

(58) Field of Classification Search
    CPC ..... G02F 1/136259; G02F 2001/13606; G02F 2001/136263; G02F 2001/136268;
    (Continued)

(56) References Cited

U.S. PATENT DOCUMENTS

| 5,517,341 A | 5/1996 | Kim et al. |
| 5,808,706 A | 9/1998 | Bae |

(Continued)

FOREIGN PATENT DOCUMENTS

| CN | 1142057 | 2/1997 |
| TW | 565813 | 12/2003 |

(Continued)

OTHER PUBLICATIONS

Taiwan: Office Action for Taiwanese Patent Application No. 097148681—Issued on Dec. 20, 2012—With English Translation.
(Continued)

*Primary Examiner* — Nathanael R Briggs
(74) *Attorney, Agent, or Firm* — Morgan, Lewis & Bockius LLP

(57) ABSTRACT

A liquid crystal display device includes an array substrate and a color filter substrate, a plurality of gate lines and a plurality of data lines formed on the array substrate such that the gate lines and the data lines intersect each other to define a plurality of pixel regions, a plurality of thin film transistors formed at respective intersections of the gate lines and the data lines, a liquid crystal layer interposed between the array and color filter substrates, and a plurality of repair patterns formed on the first substrate. Each of the plurality of the repair patterns crosses a corresponding one of the data lines, and is along and adjacent to a corresponding one of the gate lines, such that the repair pattern includes protruding ends that protrude from the corresponding data line to repair a defect on the pixel regions.

7 Claims, 24 Drawing Sheets

Related U.S. Application Data of application No. 12/314,558, filed on Dec. 12, 2008, now Pat. No. 8,629,951.

(51) Int. Cl.
  *H01L 27/12* (2006.01)
  *G02F 1/136* (2006.01)

(52) U.S. Cl.
  CPC .............. *G02F 2001/13606* (2013.01); *G02F 2001/13629* (2013.01); *G02F 2001/136263* (2013.01); *G02F 2001/136268* (2013.01); *G02F 2201/40* (2013.01)

(58) Field of Classification Search
  CPC ....... G02F 2001/13629; G02F 2201/40; H01L 27/124; H01L 27/1259
  See application file for complete search history.

(56) References Cited

U.S. PATENT DOCUMENTS

| | | |
|---|---|---|
| 5,852,482 A | 12/1998 | Kim |
| 6,628,368 B2 | 9/2003 | Yang |
| 7,026,648 B2 | 4/2006 | Lai |
| 7,291,871 B2 | 11/2007 | Lai |
| 2001/0035920 A1 | 11/2001 | Choi |
| 2004/0169781 A1 | 9/2004 | Lee et al. |
| 2007/0052878 A1 | 3/2007 | Song et al. |
| 2007/0064167 A1 | 3/2007 | Kim |
| 2007/0165180 A1* | 7/2007 | Cho .................. G02F 1/136286 349/187 |
| 2009/0153758 A1* | 6/2009 | Tsubata ............. G02F 1/136259 349/38 |

FOREIGN PATENT DOCUMENTS

| | | |
|---|---|---|
| TW | 583767 | 4/2004 |
| TW | 200714957 | 4/2007 |
| TW | 200728875 | 8/2007 |

OTHER PUBLICATIONS

Taiwan: Office Action for Taiwanese Patent Application No. 097148681—Issued on Jun. 19, 2012—With English Abstract.
Korea: Office Action for Korean Patent Application No. KR 10-2008-0038195—Issued on Dec. 10, 2010.
SIPO: First Office Action for Chinese Patent Application No. CN 2008-10187271.7—Issued on May 28, 2010—With English Translation.

* cited by examiner

ARRAY SUBSTRATE FOR LIQUID CRYSTAL DISPLAY DEVICE AND METHOD OF FABRICATING THE SAME

This application is a Divisional Application of copending U.S. patent application Ser. No. 14/102,917 as filed on Dec. 11, 2013, which claims priority to U.S. patent application Ser. No. 12/314,558 as filed on Dec. 12, 2008, which claims priority under 35 U.S.C. §119 and 35 U.S.C. §365 to Korean Patent Application No. KR 10-2008-0038195 filed in Korea on Apr. 24, 2008, all of which are hereby incorporated by reference in their entirety.

BACKGROUND OF THE INVENTION

Field of the Invention

The present invention relates to a liquid crystal display device, and more particularly, to an array substrate for a liquid crystal display (LCD) device having a repair pattern and a method of fabricating the array substrate.

Background for the Related Art

In general, a liquid crystal display (LCD) device utilizes optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules. In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

The LCD device includes an upper substrate where a common electrode is formed, a lower substrate where a pixel electrode is formed, and a liquid crystal layer interposed between the upper substrate and the lower substrate. The upper and lower substrates may be referred to as a color filter substrate and an array substrate, respectively. The liquid crystal layer is driven by a vertical electric field induced between the common and pixel electrodes such that a light transmittance and an aperture ratio of the LCD device are excellent. An active matrix LCD (AM-LCD) device includes a thin film transistor (TFT) as a switching element, and since it has excellent characteristics of high resolution and displaying moving images, the AM-LCD device has been widely utilized.

FIG. 1 is an exploded perspective view that schematically illustrates such an AM-LCD device according to the related art. As shown in FIG. 1, the LCD device includes an array substrate 10, a color filter substrate 20, and a liquid crystal layer 30. The array substrate 10 and the color substrate 20 face each other, and the liquid crystal layer 30 is interposed therebetween. The array substrate 10 includes a first substrate 12 on which a gate line 14, a data line 16, a TFT "Tr" and a pixel electrode 18 are formed. The gate line 14 and the data line 16 cross each other, thereby forming a region between the gate and data lines 14 and 16. The region is defined as a pixel region "P". The TFT "Tr" is formed at a crossing portion between the gate and data lines 14 and 16, and the pixel electrode 18 is formed in the pixel region "P" and connected to the TFT "Tr".

The color filter substrate 20 includes a second substrate 22 on which a black matrix 25, a color filter layer 26 and a common electrode 28 are formed. The black matrix 25 has a lattice shape to cover a non-display region of the first substrate 12, such as the gate line 14, the data line 16, the TFT "Tr". The color filter layer 26 includes first, second and third sub-color filters 26a, 26b and 26c. Each of the sub-color filters 26a, 26b and 26c has one of red, green and blue colors R, G and B and corresponds to the each pixel region "P". The common electrode 28 is formed on the black matrix 25 and the color filter layers 26 and over an entire surface of the second substrate 22.

Although not shown, to prevent the liquid crystal layer 30 from leaking, a seal pattern may be formed along edges of the first and second substrates 12 and 22. First and second alignment layers may be formed between the first substrate 12 and the liquid crystal layer 30 and between the second substrate 22 and the liquid crystal layer 30. A polarizer may be formed on an outer surface of the first and second substrates 12 and 22. The LCD device also includes a backlight assembly opposing an outer surface of the first substrate 12 to supply light to the liquid crystal layer 30. When a scanning signal is applied to the gate line 14 to control the TFT "Tr", a data signal is applied to the pixel electrode 18 through the data line 16 such that the electric field is induced between the pixel and common electrodes 18 and 28. Then, the electric field causes the liquid crystals to switch on and as a result, the LCD device produces images using the light from the backlight assembly.

FIG. 2 is a plan view schematically illustrating a portion of an array substrate for the related art LCD device. In FIG. 2, a plurality of gate lines 14 are formed on the array substrate 10. The gate lines 14 are spaced apart from each other. Although not shown, a gate pad for connecting to an external driving circuit substrate is formed at one end of the gate line 14. A data line 16, which crosses the gate line 14 to define a pixel region P, is formed on the array substrate 10. A data pad (not shown) for connecting to an external driving circuit substrate (not shown) is formed at one end of the data line 16. A thin film transistor (TFT) Tr including a gate electrode 15, a semiconductor layer 40, a source electrode 43 and a drain electrode 47 is formed at a crossing portion (overlapped portion) of the gate and data lines 14 and 16. A pixel electrode 18 is formed in each pixel region P. The pixel electrode 18 is connected to the TFT Tr. The pixel electrode 18 overlaps the gate line 14, thereby forming a storage capacitor StgC to maintain a present voltage until a next signal is applied into the pixel electrode 18.

The array substrate 10 may be formed through four or five mask processes. For example, each mask process may further include five steps: a step of forming a photoresist (PR) layer on a material layer, a step of exposing the PR layer using a mask, a step of developing the PR layer to form a PR pattern, a step of etching the material layer using the PR pattern as an etching mask, and a step of stripping the PR pattern. Thus, twenty or twenty-five steps are needed to form the array substrate 10. During these steps, an electrical short or electrical opening problem by static electricity or metallic particles may occur, when the metallic particles are attached to the gate line 14, the data line 16, or the TFT Tr. In such a situation, a voltage is continuously applied into the pixel electrode 18 or no voltage is applied into the pixel electrode 18. As a result, ON or OFF state of the pixel electrode 18 cannot be controlled such that all pixel regions P along the corresponding gate line 14 or the data line 16 always have an ON or OFF state.

The LCD devices have several ten thousands to several millions pixel regions depending on their sizes and resolutions. Therefore, failure costs can be high when there are requirements in all of these pixel regions to have a desired condition. Accordingly, some defective pixels in the LCD device are endured (absorptive). However, when an electrical short occurs in a crossing portion of the gate and data lines 14 and 16, there is a bright or dark spot problem in all pixel regions connected to corresponding gate and data lines 14 and 16, thereby causing the LCD device to be rendered unacceptable. This problem is also referred to as a line defect. However, when there is a defect in merely one or several pixels, the LCD device can be available, and this defect is referred to as a dot defect.

Recently, in order to improve a high quality displaying image, a repair process has been proposed to repair the LCD device having the dot defect. Specifically, in a normally white mode LCD device, a white image is displayed when no voltage is applied and a black image is displayed when a maximum voltage is applied. Since a defective pixel always displays a white image and thus stands out conspicuously, the repair process is required to change the defective pixel into a pixel that always displays a black image. That is, a white-colored defective pixel is repaired to change into a black-colored defective pixel. The reason for this repair process is that a white pixel in a black base is much more prominent than the other scenario. Accordingly, by repairing a white-colored defective pixel into a black-colored defective pixel without repairing a black-colored defective pixel, and acceptable LCD is provided.

FIG. 3 is a plan view schematically illustrating the repairing process for the array substrate of the LCD device according to the related art. As shown in FIG. 3, in a normally white mode LCD device, when there is a white-colored defect in a pixel region P of an array substrate, a TFT Tr is disconnected from a pixel electrode 18 by irradiating a laser onto a cutting line CL, and a portion of the pixel electrode 18, which overlaps a portion of the gate line 14, is electrically connected to the portion of the gate line 14 by irradiating a laser onto a connecting portion CP such that a voltage is continuously applied into the pixel electrode 18 in the pixel region P. As a result, the pixel region P has a black-colored defective state.

On the other hand, in a normally black mode LCD device, when there is a white-colored defect in a pixel region for an array substrate, a TFT is disconnected from a pixel electrode by irradiating a laser onto a cutting line CL without connecting the pixel electrode to the gate line such that no voltage is applied into the pixel electrode in the pixel region. As a result, the pixel region P has a black-colored defective state. However, the above repairing process is available only for a dot defect and not for a line defect. Accordingly, the LCD device having the line defect cannot be repaired, thereby decreasing a production yield, and increasing failure costs and production costs.

SUMMARY OF THE INVENTION

Accordingly, the present invention is directed to an array substrate and a method of fabricating the same that substantially obviate one or more of the problems due to limitations and disadvantages of the related art.

An object of the present invention is to provide a liquid crystal display device having an array substrate with a repair pattern that is capable of repairing a defect.

Another object of the present invention is to provide a method of repairing an array substrate having a defect for a liquid crystal display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes first and second substrates facing each other, a plurality of gate lines and a plurality of data lines formed on the first substrate such that the gate lines and the data lines intersect each other to define a plurality of pixel regions, a plurality of thin film transistors formed at respective intersections of the gate lines and the data lines, a liquid crystal layer interposed between the first and second substrates, and a plurality of repair patterns formed on the first substrate. Each of the plurality of the repair patterns crosses a corresponding one of the data lines, and is along and adjacent to a corresponding one of the gate lines, such that the repair pattern includes protruding ends that protrude from the corresponding data line to repair a defect on the pixel regions.

In another aspect, a liquid crystal display device includes first and second substrates facing each other, a plurality of gate lines and a plurality of data lines formed on the first substrate such that the gate lines and the data lines intersect each other to define a plurality of pixel regions, a plurality of thin film transistors formed at respective intersections of the gate lines and the data lines, and a liquid crystal layer interposed between the first and second substrates. Each of the plurality of the gate lines includes a first gate line and a second gate line such that the first gate line has a linear bar shape and has a crossing portion with the data line, and the second gate line is formed to create a two-way path with the first gate line at the crossing portion.

In still another aspect, a method of repairing an array substrate having a defect for a liquid crystal display device includes forming a gate line along a substrate and a repair pattern having a bar shape on the substrate, the repair pattern parallel to and spaced apart from the gate line, forming a data line crossing the gate line and the repair pattern, pixel regions in a matrix shape being defined by crossing the gate and data lines, forming thin film transistors in the pixel regions, forming pixel electrodes in the respective pixel regions and connected to the thin film transistors, irradiating a first laser beam onto first portions positioned around an overlapped portion of the gate and data lines such that the overlapped portion is electrically disconnected from the gate line when an electrical short is generated at the overlapped portion, irradiating a second laser beam onto second portions positioned adjacent to the first portions and the repair pattern to form first grooves exposing second portions and second grooves exposing the ends of the repair pattern, irradiating a third laser beam to form a first contact pattern in each of the first grooves and a second contact pattern in each of the second grooves by a chemical vapor deposition (CVD) repair apparatus, and forming a connection pattern connecting the first contact pattern with the second contact pattern by the CVD repair apparatus.

In still another aspect, a method of repairing an array substrate having a defect for a liquid crystal display device includes forming a gate line including first and second gate lines on a substrate, wherein the second gate line is branched from the first gate line to form a two-way path structure for the gate line, forming a data line crossing the gate line to form a crossing portion, thereby defining first to fourth pixel regions arranged in a matrix shape, forming a thin film transistor in the second pixel region and connected to the gate and date lines, forming a pixel electrode in the second pixel region and connected to the thin film transistor, and irradiating a laser beam onto the crossing portion of the gate and data lines such that the data line is electrically disconnected from the first gate line, and the pixel electrode is electrically disconnected from the thin film transistor, respectively, when an electrical short is generated at an overlapped portion of the gate and data lines It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings.

Figure 1:
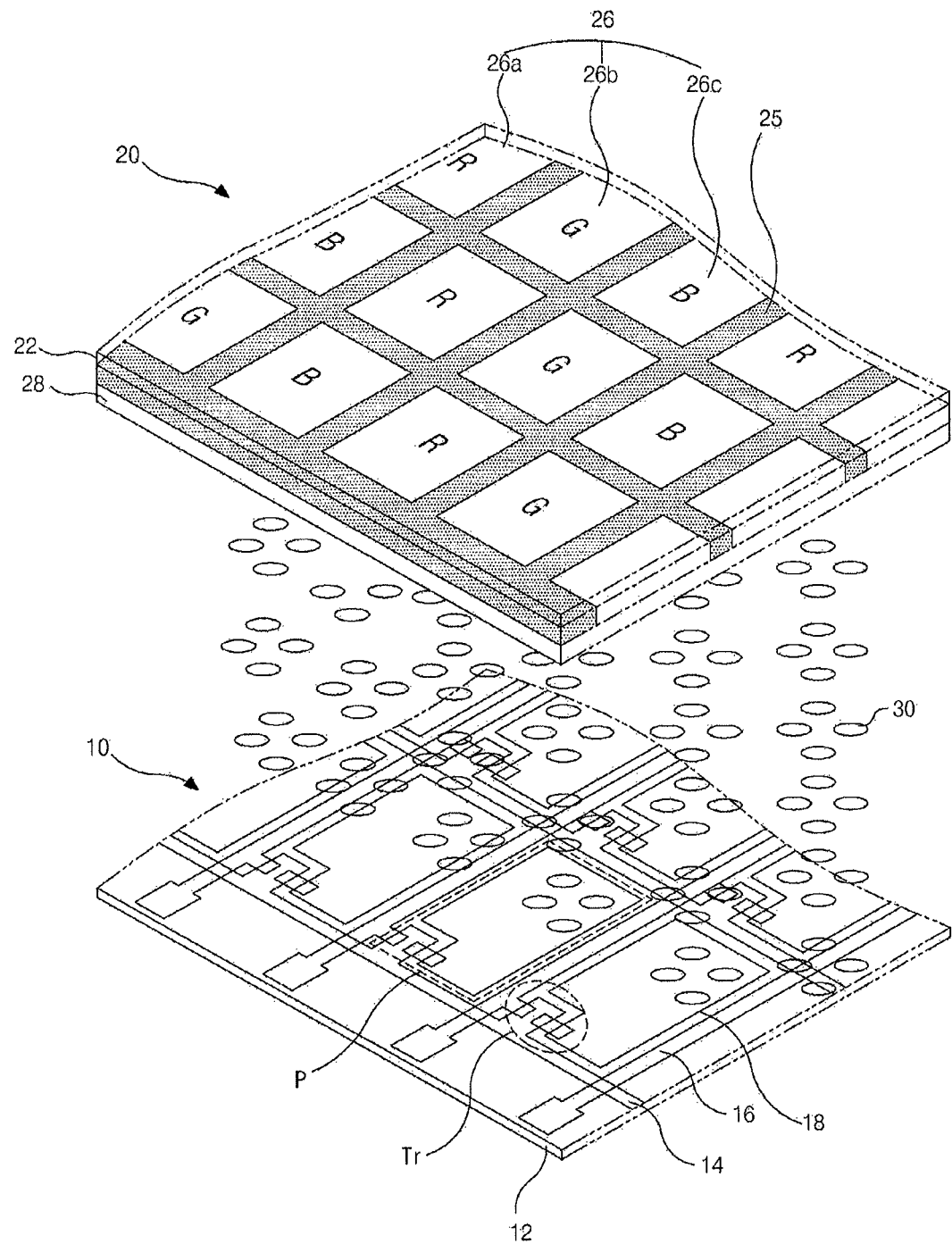
FIG. 1 is an exploded perspective view schematically illustrating an LCD device according to the related art.
Figure 2:
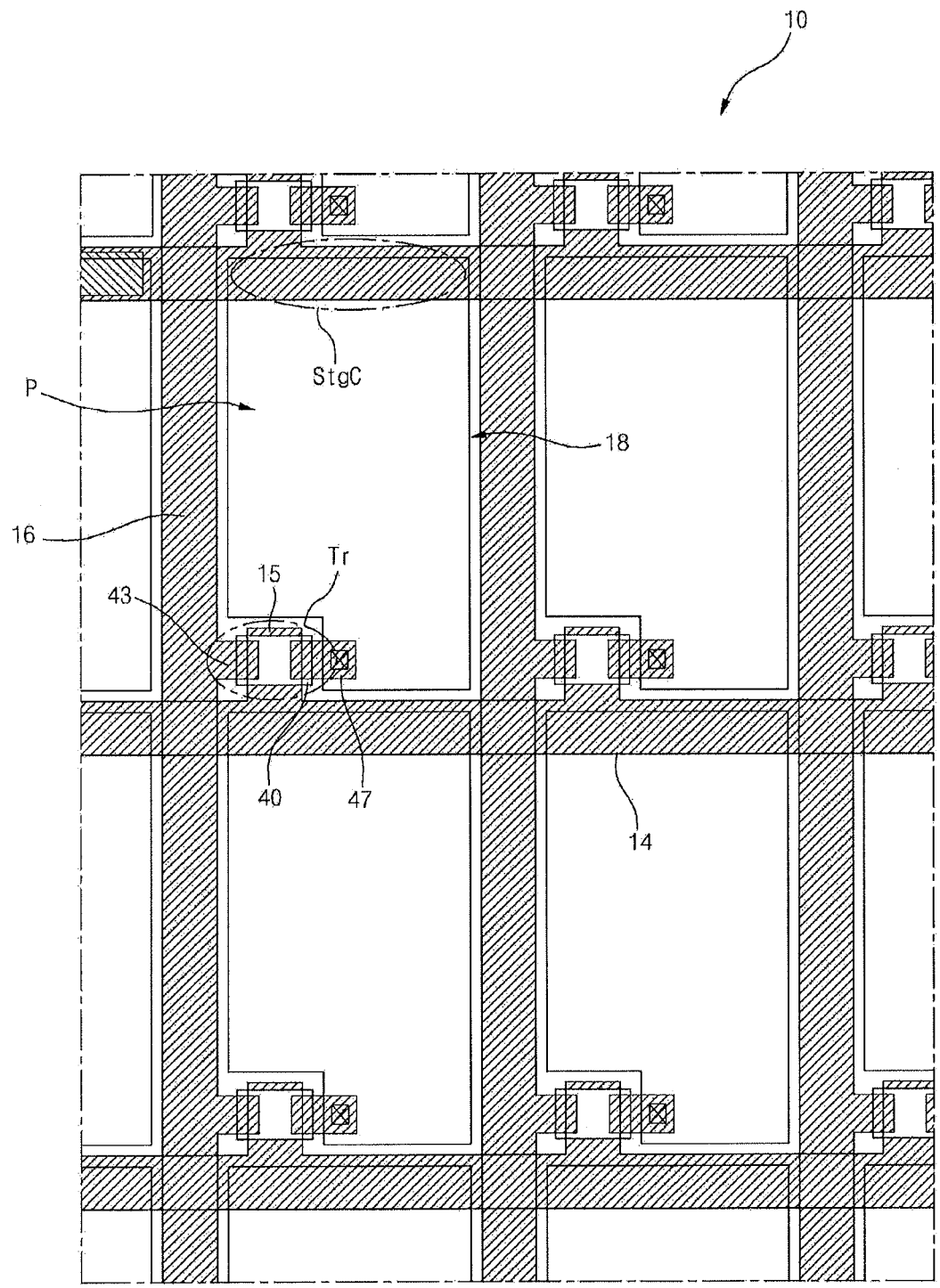
FIG. 2 is a plan view schematically illustrating a portion of an array substrate for the related art LCD device.
Figure 3:
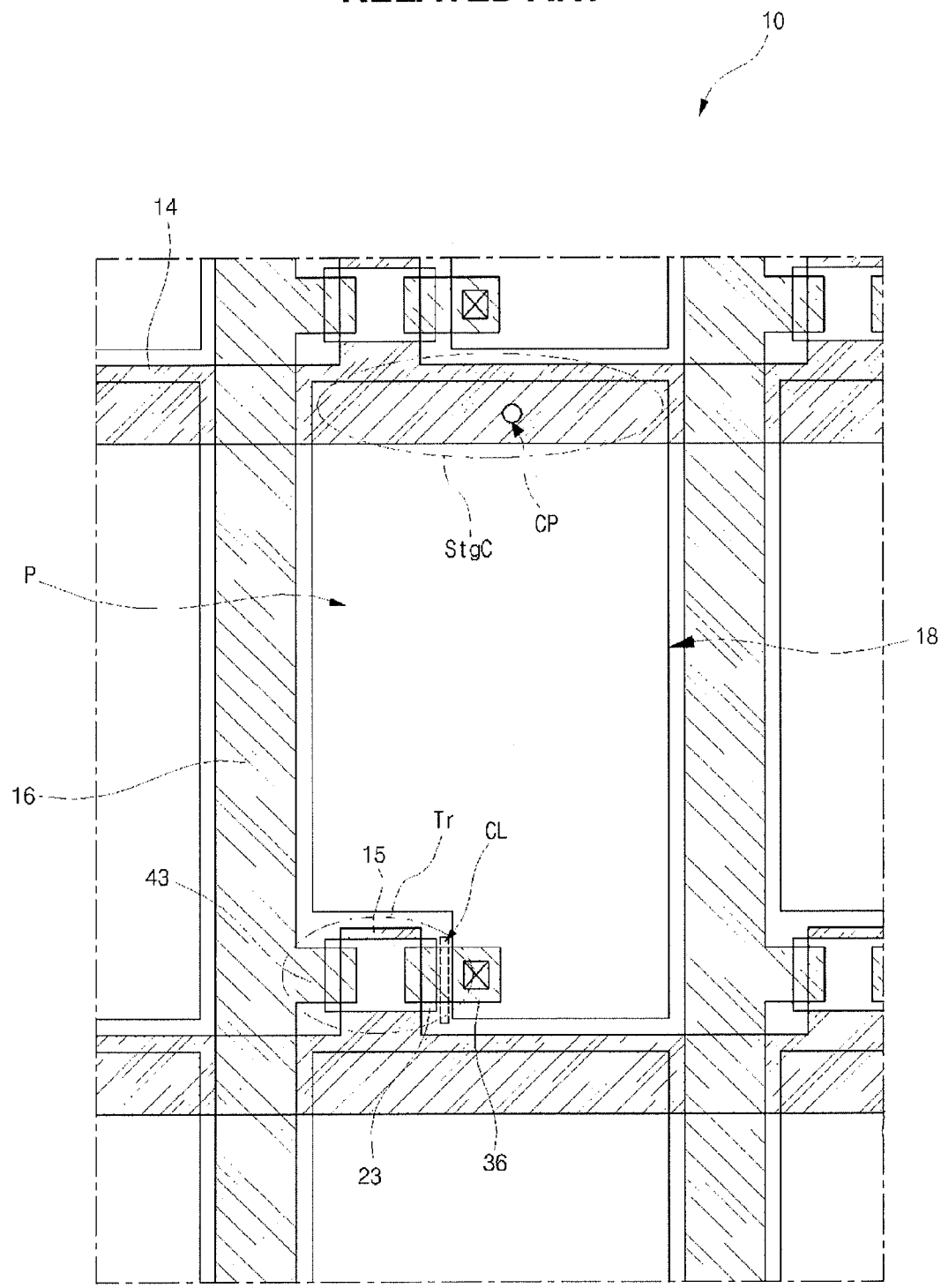
FIG. 3 is a plan view schematically illustrating a repairing process for the array substrate for the LCD device according to the related art.
Figure 4:
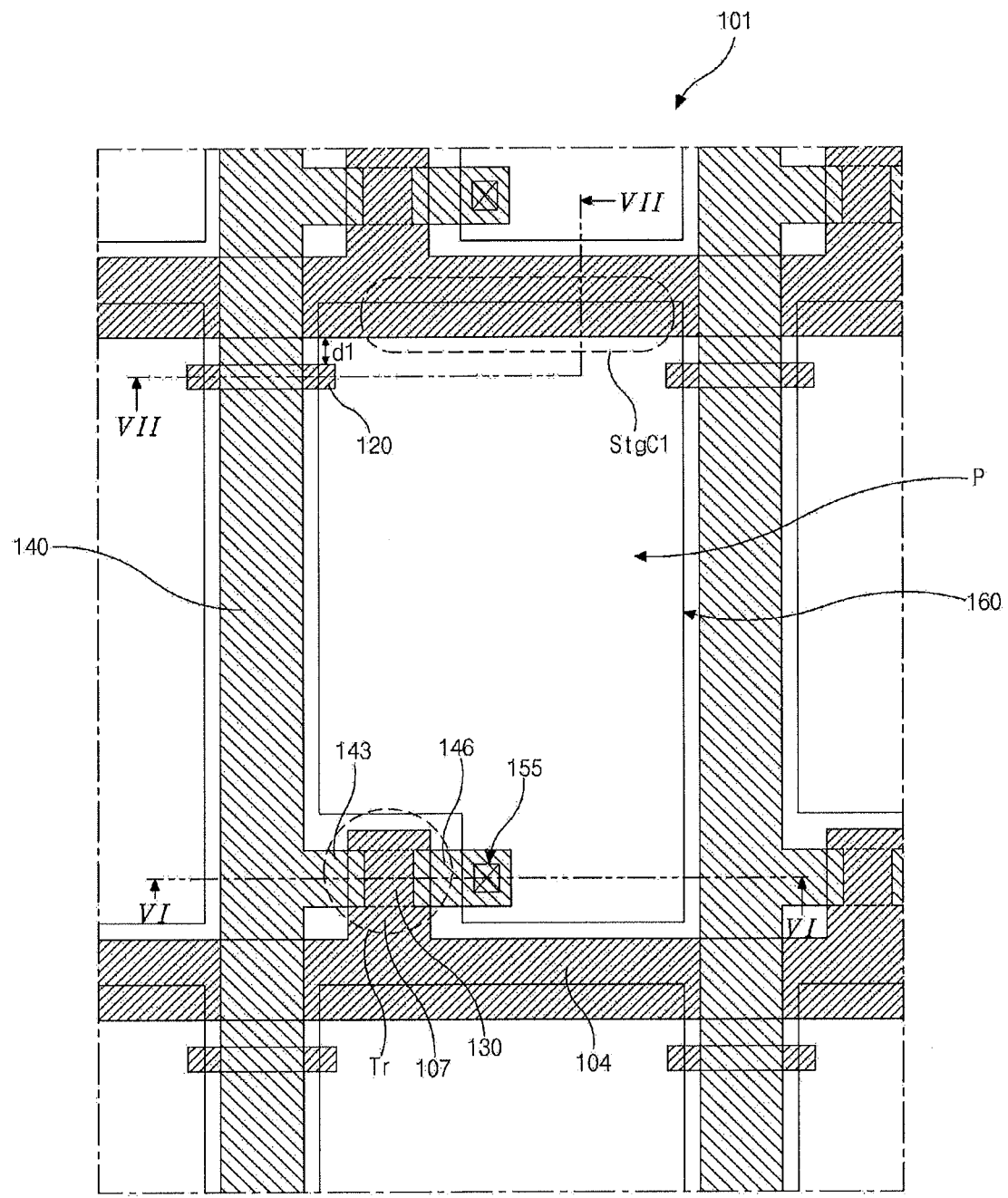
FIG. 4 is a plan view schematically illustrating a portion of an array substrate for an LCD device according to a first exemplary embodiment of the present invention.

FIG. 4 is a plan view schematically illustrating a portion of an array substrate 101 for an LCD device according to a first exemplary embodiment of the present invention. In FIG. 4, a plurality of gate lines 104 are formed on the array substrate 101. A data line 140, which crosses the gate line 104 to define a pixel region P, is formed on the array substrate 101. A gate pad (not shown) for receiving a signal voltage from an external driving circuit unit (not shown) is formed at one end of the gate line 104, and a data pad (not shown) for receiving a signal voltage from an external driving circuit unit (not shown) is formed at one end of the data line 140.

A thin film transistor (TFT) Tr including a gate electrode 107, a semiconductor layer 130 including an active layer (not shown) and an ohmic contact layer (not shown), a source electrode 143 and a drain electrode 146 are connected to the gate and data lines 104 and 140. The TFT Tr is disposed in each pixel region P. The gate electrode 107 is electrically connected to the gate line 104, and the semiconductor layer 130 is stacked on the gate electrode 107. The source and drain electrodes 143 and 146 are disposed on the ohmic contact layer, and the source electrode 143 is electrically connected to the data line 140. A pixel electrode 160 is formed in each pixel region P. The pixel electrode 160 is electrically connected to the drain electrode 146 of the TFT Tr.

The pixel region is also formed with a first storage capacitor STgC1 including a portion of the gate electrode 104 as a first storage electrode, a portion of the pixel electrode 160 as a second storage electrode, and a gate insulating layer (not shown) and a passivation layer (not shown) as a dielectric material layer. The gate insulating layer and the passivation layer are interposed between the first and second storage electrodes.

A repair pattern 120 is formed to be along and adjacent to the gate line 104. The repair pattern 120 extends over adjacent two pixel regions P. The repair pattern 120 crosses the data line 140 between the adjacent two pixel regions P. The repair pattern 120 has a greater width than the data line 140 such that both ends of the repair pattern 120 protrude beyond the data line 140. The protruding ends of the repair pattern 120 are used for repairing a defective pixel. Accordingly, the protruding ends have a minimum length (protruding distance) considering a repairing process. For example, each of the protruding ends may have a protruding distance along the gate line 104 of about 8 micrometers to about 15 micrometers.

The repair pattern 120 is formed on the same layer and is of the same material as the gate line 104. The repair pattern 120 has a bar shape along a length direction of the gate line 104. The repair pattern 120 has a minimum distance d1 from the gate line 104 closest to the repair pattern 120 considering a dimension of a patterning apparatus. For example, the distance d1 between the repair pattern 120 and the gate line 104 may be about 3 micrometers to about 5 micrometers. The reason why the repair pattern 120 is formed to have a minimum size is that a decrease of an aperture ratio resulted from the repair pattern 120 is to be minimized. Moreover, a parasitic capacitance generated between the data line 140 and the repair pattern 120 is also minimized. A repairing method using the repair pattern 120 is explained later.

The TFT Tr may have various structures. For example, a central portion of the source electrode 143 may be dented such that a portion of the active layer exposed between the source and drain electrodes 143 and 146 has a "U" or "⊂" shape and the drain electrode 146 may be inserted into the dented portion of the source electrode 143. The gate electrode 107 may protrude from the gate line 104 or a portion of the gate line 104.

Figure 5:
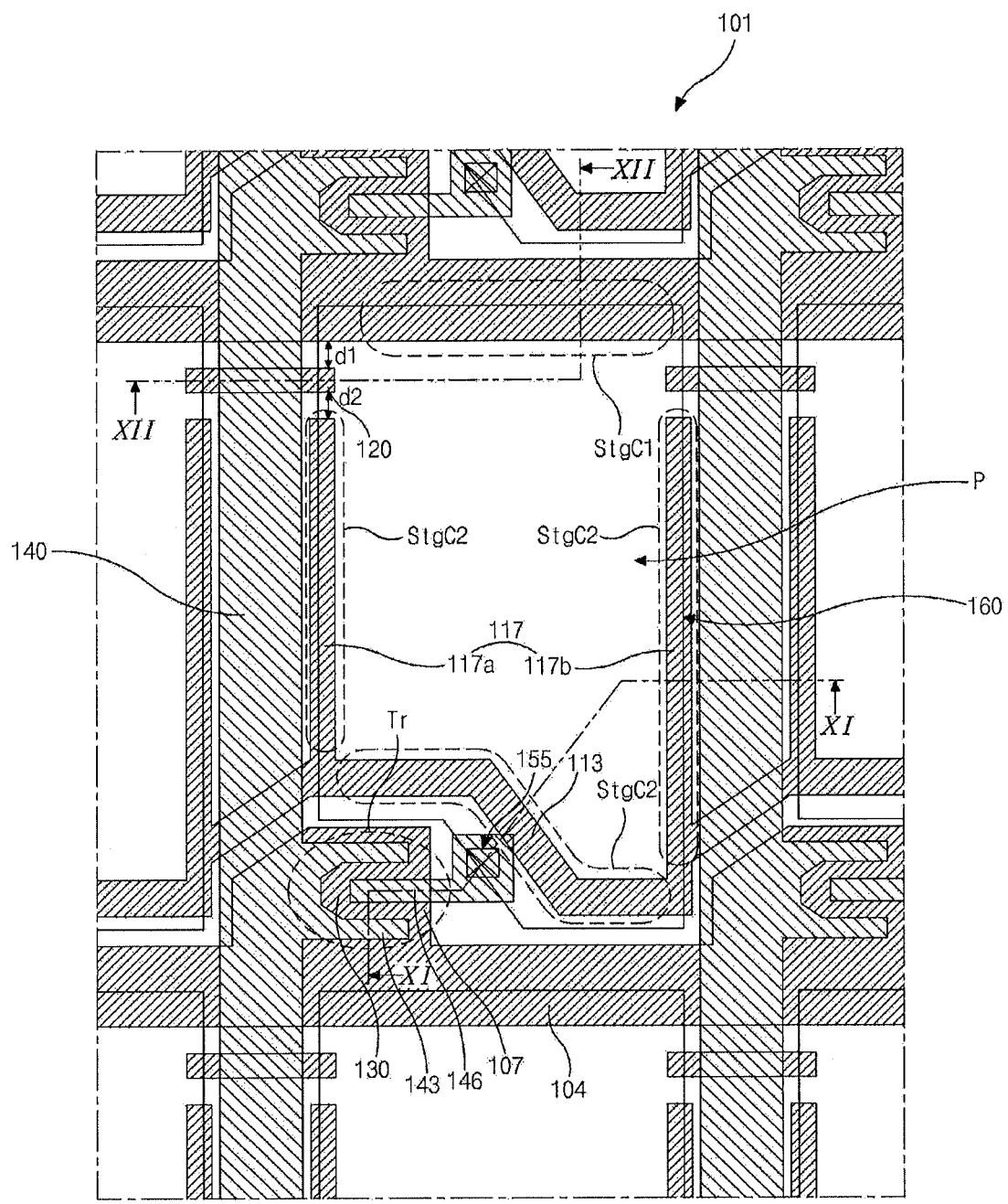
FIG. 5 is a plan view schematically illustrating a portion of an array substrate for an LCD device according to a second exemplary embodiment of the present invention.

FIG. 5 is a plan view schematically illustrating a portion of an array substrate for an LCD device according to a second exemplary embodiment of the present invention. As shown in FIG. 5, a portion of the active layer (not shown) between the source and drain electrodes 143 and 146 has a "⊂" shape. The "⊂" shaped portion of the active layer may be referred to as a channel region. In FIG. 5, a gate line 104 and a storage line 113 are formed on the substrate 101. The gate and storage lines 104 and 113 are spaced apart from each other. The storage line 113 is substantially parallel to the gate line 104. A storage pattern 117 includes first and second storage patterns 117a and 117b that are formed in the pixel region P. The first storage pattern 117a extends from one end of the storage line 113 to be parallel to a left side data line 140, and the second storage pattern 117b extends from the other end of the storage line 113 to be parallel to a right side data line 140. In this case, the storage line 113 and the first and second storage patterns 117a and 117b serve as a third storage electrode. A portion of the pixel electrode 160, which overlaps the storage line 113 and the first and second storage patterns 117a, serves as a fourth storage electrode such that a second storage capacitor StgC2 is formed with an insulating layer between the third and fourth storage electrodes. As illustrated in FIG. 4, a portion of the gate electrode 104, a portion of the pixel electrode 160 and a dielectric material layer constitute a first storage capacitor StgC1. Accordingly, the array substrate has a sufficient storage capacitance.

In the array substrate 101 according to the second exemplary embodiment, a repair pattern 120 is also disposed across two adjacent pixel regions P. That is, the repair pattern 120 extends over the adjacent two pixel regions P. The repair pattern 120 has a first distance d1 from the gate line 104. The first distance d1 may be about 3 micrometers to about 5 micrometers from the gate line 104 closest to the repair pattern 120. Moreover, the repair pattern 120 is apart from an end of each of the first and second storage patterns 117a and 117b with a second distance d2. The second distance d2 may be about 3 micrometers to about 5 micrometers. The repair pattern 120 is disposed between the gate line 104 and the end of each of the first and second storage patterns 117a and 117b. The repair pattern 120 may have substantially the same distance from the gate line 104, the first storage pattern 117a and the second storage pattern 117b. In other words, the distance d1 may be equal to the distance d2. Also, if a patterning apparatus, for example, an exposure apparatus, has an improved dimension, the first and second distances d1 and d2 may have a value of smaller than 3 micrometers.

The repair pattern 120 may have a width equal to or smaller than a distance between outer lines of the first and second storage patterns 117a and 117b at both sides of the data line 140. That is, each end of the repair pattern 120 is closer to the data line 140 than the outer line of each of the first and second storage patterns 117a and 117b. Such an exemplary arrangement is able to prevent a decrease of an aperture ratio. Although not shown, a color filter substrate, which faces the array substrate 101, and a liquid crystal layer, which is interposed between the array substrate 101 and the color filter substrate, constitutes an LCD device. In this case, a black matrix is formed on the color filter substrate and corresponds to the gate line 104, the data line 140, and a switching region where the TFT Tr is formed. The black matrix has a greater width than each of the gate line 104 and the data line 140 considering an aligning margin. A region not covered with the black matrix is defined as a real aperture region. The black matrix covers not only the data line 140 but also the storage pattern 117. When the repair pattern 120 has a greater width than a distance between outer lines of the first and second storage patterns 117a and 117b at both sides of the data line 140, the repair pattern 120 protrudes beyond the first and second storage patterns 117a and 117b, and an aperture ratio is reduced because of a protruding portion of the repair pattern 120. Accordingly, the repair pattern 120 has a width being equal to or smaller than a distance between the outer lines of the first and second storage patterns 117a and 117b at both sides of the data line 140, thereby preventing the decrease of the aperture ratio.

Figure 6:
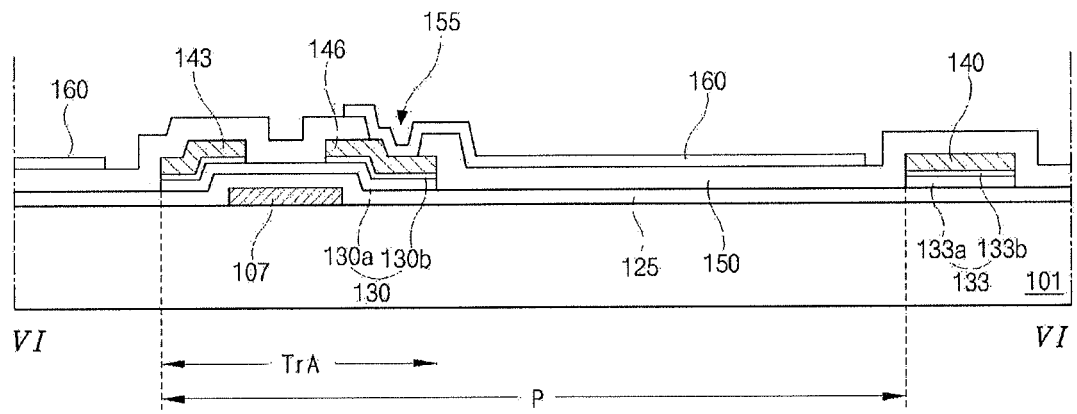
FIG. 6 is a cross-sectional view taken along the line VI-VI in FIG. 4.
Figure 7:
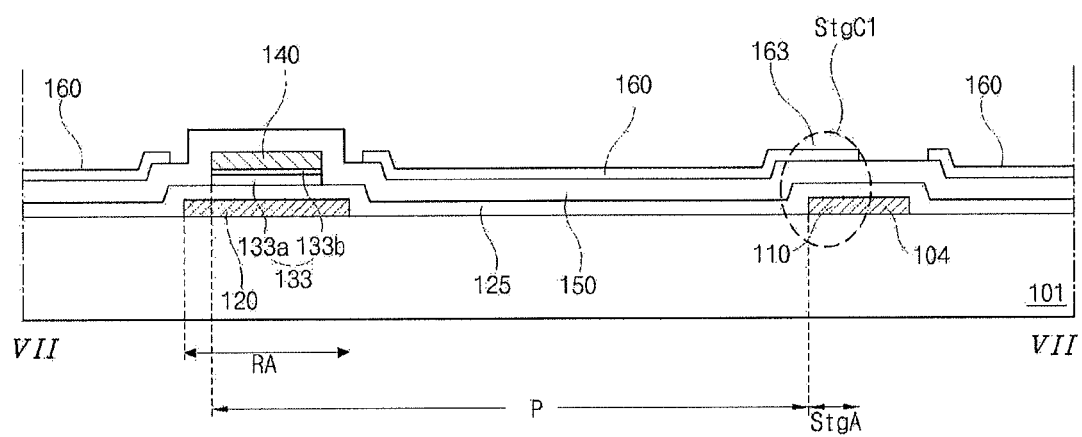
FIG. 7 is a cross-sectional view taken along the line VII-VII in FIG. 4.

FIG. 6 is a cross-sectional view taken along the line VI-VI in FIG. 4, and FIG. 7 is a cross-sectional view taken along the line VII-VII in FIG. 4. As shown in FIG. 6, a switching region TrA where the TFT Tr is formed is defined in a pixel region P. As shown in FIG. 7, a repair region RA where the repair pattern 120 is formed, and a storage region StgA where the first storage capacitor StgC1 is formed, are defined in the substrate 101. Referring to FIGS. 4, 6 and 7, the gate line 104 is formed on the substrate 101. In the switching region TrA, the gate electrode 107 extending from the gate line 104 or being a portion of the gate line 104 is formed on the substrate 101. The repair pattern 120 of a bar shape is formed in the repair region RA to be adjacent to the gate line 104. The repair pattern 120 may be formed on the same layer and the same material as the gate line 104 and the gate electrode 107. The repair pattern 120 has a first distance d1 of about 3 micrometers to about 5 micrometers from the gate line 104. The repair pattern 120 has an island or island bar shape. The gate line 104 in the storage region StgA serves as a first storage electrode 110.

On the other hand, in the array substrate according to the second embodiment of the present invention as shown in FIG. 5, the storage line 113 (of FIG. 5) and the storage pattern 117 including the first and second storage patterns 117a and 117b are further formed. The storage line 113 extends along the gate line 104, and each of the first and second storage patterns 117a and 117b (of FIG. 5) extends from the storage line 113 along the data line 140. In this case, the repair pattern 120 has a second distance d2 (of FIG. 5) of about 3 micrometers to about 5 micrometers from an end of each of the first and second storage patterns 117a and 117b.

Referring again to FIGS. 4, 6 and 7, a gate insulating layer 125 is formed on the gate line 104, the gate electrode 107 and the repair pattern 120. When the storage line 113 and the storage pattern 117 are formed on the substrate 101 as shown in FIG. 5, the gate insulating layer 125 is also formed on the storage line 113 and the storage pattern 117. Although not shown, a gate pad electrode connected to an end of the gate line 104 is formed on the substrate 101 before the gate insulating layer 125.

The semiconductor layer 130, which includes an active layer 130a of intrinsic amorphous silicon and an ohmic contact layer 130b of impurity-doped amorphous silicon, is formed on the gate insulating layer 125 in the switching region TrA. In addition, the source and drain electrodes 143 and 146 are formed on the ohmic contact layer 130b and spaced apart from each other.

The data line 140 is formed on the gate insulating layer 125. The data line 140 crosses the gate line 104 to define the pixel region P and is connected to the source electrode 143. The data line 140 also crosses the repair pattern 120. A data pad electrode (not shown) is formed on the gate insulating layer 125 to be connected to an end of the data line 140. A semiconductor pattern 133 including first and second patterns 133a and 133b are disposed under the data line 140. The semiconductor pattern 133 may exist under the data line 140 or not, depending on a fabricating method.

A passivation layer 150 including a drain contact hole 155, a gate pad contact hole (not shown) and a data pad contact hole (not shown) is formed on the source and drain electrodes 143 and 146 and the data line 140. The drain contact hole 155 exposes a portion of the drain electrode 146, and the data pad contact hole exposes the data pad electrode. The gate pad contact hole exposes the gate pad electrode through the gate insulating layer 125.

The pixel electrode 160 of a transparent conductive material is formed on the passivation layer 150. The pixel electrode 160 contacts the drain electrode 146 through the drain contact hole 155 and extends into the storage region StgA, thereby overlapping a portion of the gate line 104. The overlapped portion of the pixel electrode 160 in the storage region StgA serves as a second storage electrode 163. That is, a portion of the pixel electrode 160 overlaps a portion of the previous gate line 104. The first storage capacitor StgC1 may include the overlapped portion of the gate line 104 as the first storage electrode 110, the overlapped portion of the pixel electrode 160 as the second storage electrode 163, and a dielectric material layer, such as the gate insulating layer 125 and the passivation layer 150, between the first and second storage electrodes 110 and 163. Although the pixel electrode 160 overlaps a portion of the repair pattern 120, the pixel electrode 160 may be spaced apart from the repair pattern 120.

Referring to FIG. 5, the pixel electrode 160 also overlaps the storage line 113 and the storage pattern 117. The second storage capacitor StgC2 may be formed with the overlapped portion of the storage line 113 and the storage pattern 117 as the third storage electrode, the overlapped portion of the pixel electrode 160 as the fourth storage electrode, and a dielectric material layer, such as the gate insulating layer 125 and the passivation layer 150, between the third and fourth storage electrodes.

Referring back to FIGS. 4, 6 and 7, a gate auxiliary pad electrode (not shown) contacting the gate pad electrode through the gate pad contact hole and a data auxiliary pad electrode (not shown) contacting the data pad electrode through the data pad contact hole are formed on the passivation layer 150. Each of the gate and data auxiliary pad electrodes is formed of the same material as the pixel electrode 160.

When there is a line defect, for example, an electrical short occurred at a crossing portion of the gate and data lines 104 and 140, an outside of the crossing portion of the gate and data lines 104 and 140 is cut by irradiating a laser beam. The laser cutting is performed in adjacent two pixel regions P. At the same time, in a pixel region including the repair pattern 120 connected to the corresponding gate line 104, the pixel electrode 160 overlapping the corresponding repair pattern 120 and the gate line 104 overlapping the corresponding pixel electrode 160 are cut along a perimeter of the repair pattern 120 and a connection pattern (not shown), which may be formed by a chemical vapor deposition (CVD) method using a laser beam. The above cutting process for the pixel electrode 160 overlapping the corresponding repair pattern 120 and the gate line 104 overlapping the corresponding pixel electrode 160 is performed to prevent an electrical connection between the pixel electrode 160, which does not overlap the repair pattern 120, and each of the repair pattern 120 and the connection pattern (not shown)

Next, the connection pattern (not shown) is formed on a portion of the pixel electrode 160 by a CVD process. The portion, where the connection pattern is formed, of the pixel electrode 160 is electrically isolated by the laser cutting. The connection pattern is connected to an end of the repair pattern 120 and a portion of the gate line 104. The portion, where the connection pattern is connected, of the gate line 104 is outside of the cutting line of the gate line 104. Due to the connection pattern, the gate line 104 at both sides of the electrical short generating portion is electrically connected to the repair pattern 120 such that the line defect can be changed into a dot defect in one pixel region P. When the portion of the gate line 104 is cut, the drain electrode 146 of the TFT Tr connected to the electrical short generating portion is also cut such that the corresponding pixel electrode 160 is electrically disconnected from the corresponding TFT Tr. As a result, the corresponding pixel region P has a black-colored state. The cut process into the drain electrode 146 may be omitted.

Figure 8:
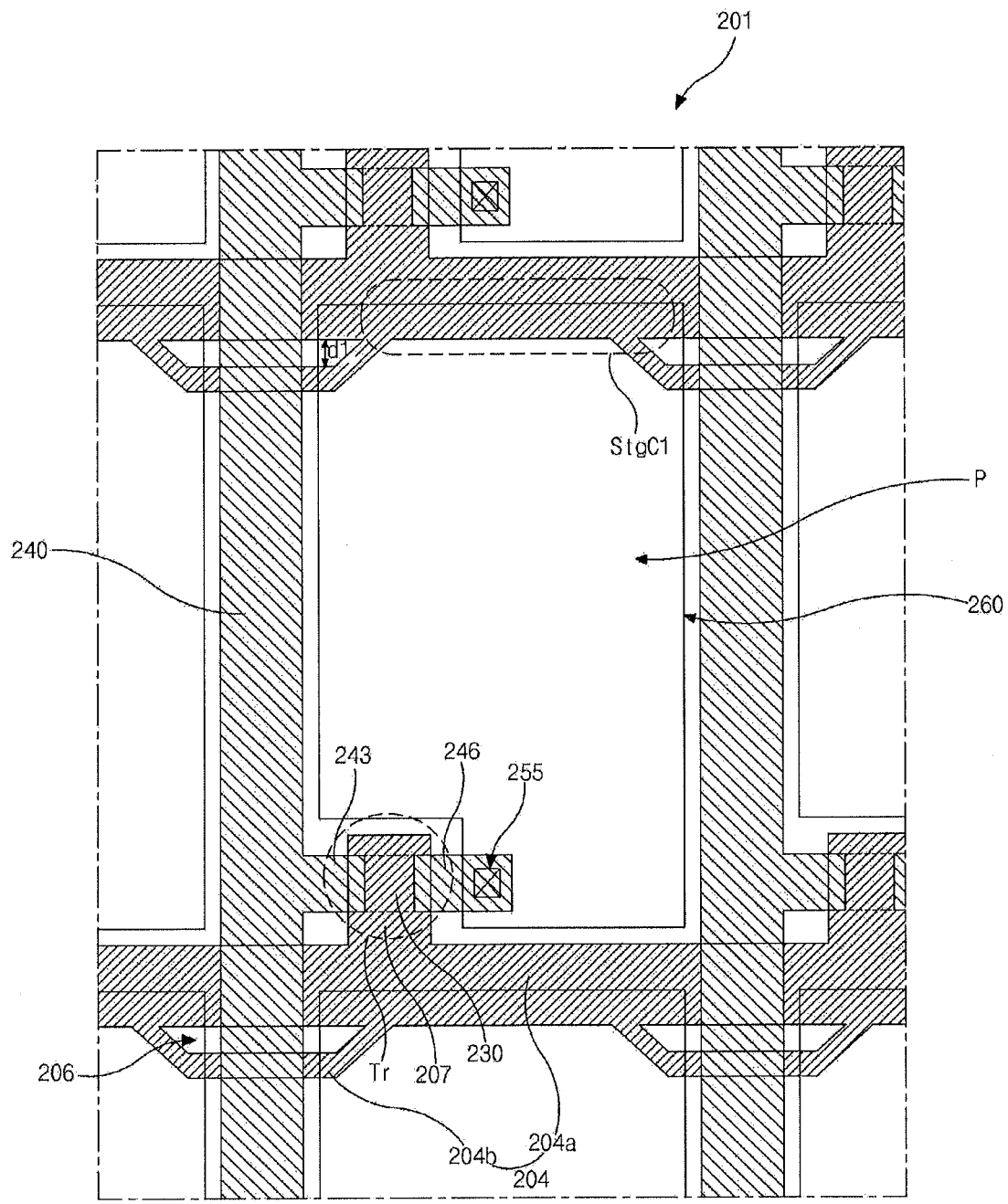
FIG. 8 is a plan view schematically illustrating a portion of an array substrate for an LCD device according to a third exemplary embodiment of the present invention

FIG. 8 is a plan view schematically illustrating a portion of an array substrate for an LCD device according to a third exemplary embodiment of the present invention. Here, different elements from those of the array substrate according to the above first exemplary embodiment are explained. In this exemplary embodiment, there are the major characteristics of the array substrate in a gate line, and there is no repair pattern 120 (of FIG. 4) in the array substrate.

As shown in FIG. 8, a gate line 204 crosses a data line 240 to define a pixel region P. A TFT Tr is formed in each pixel region P. The TFT Tr is connected to the gate and data lines 204 and 240. Beside a shape of TFT Tr shown in FIG. 8, the TFT Tr has a channel of "U" or "⊂" shape. A pixel electrode 260 in each pixel region P is connected to a drain electrode 246 of the TFT Tr through a drain contact hole 255 and overlaps a previous gate line 204. A gate pad electrode (not shown) and a data pad electrode (not shown) are formed at an end of the gate and data lines 204 and 240, respectively. An overlapped portion of the gate line 204 and the pixel electrode 260 serves as a first storage capacitor StgC1.

The gate line 204 includes first and second gate lines 204a and 204b. The first gate line 204a has a linear bar shape. The second gate line 204b corresponds to a crossing portion of the first gate line 204a and the data line 240. One end of the second gate line 204b is connected to one portion of the first gate line 204a, and the other end of the second gate line 204b is connected to another portion of the first gate line 204a. That is, the one and another portions of the first gate line 204a correspond to both outer side positions of the crossing portion of the first gate line 204a and the data line 240 such that the gate line 204 has a hole 206 corresponding to the crossing portion of the gate and data lines 204 and 240. In other words, the gate line 204 has a two-way path at the crossing portion of the gate and data lines 204 and 204.

Figure 9:
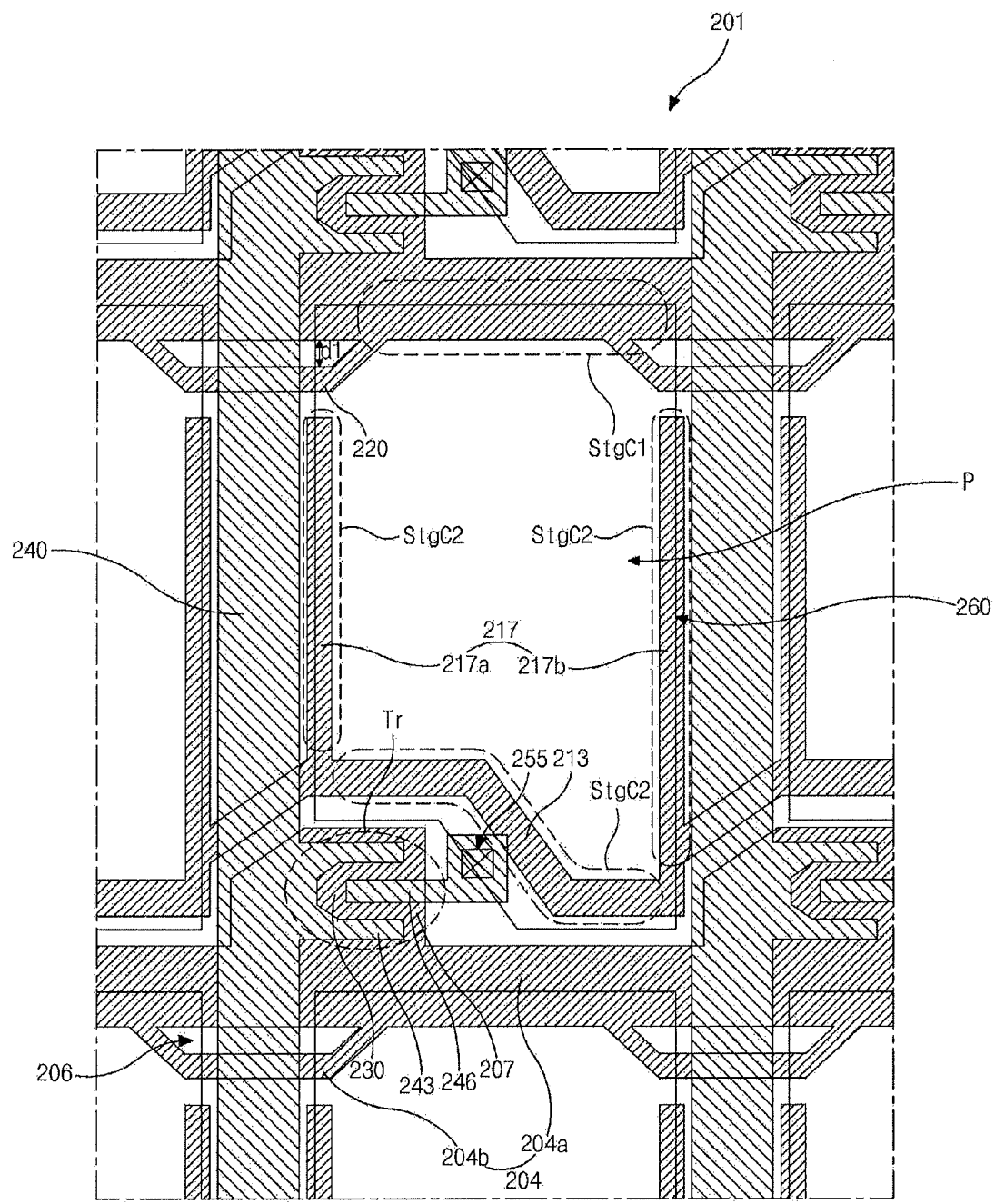
FIG. 9 is a plan view of a portion of an array substrate for an LCD device according to a fourth exemplary embodiment of the present invention.

FIG. 9 is a plan view schematically illustrating a portion of an array substrate for an LCD device according to a fourth exemplary embodiment of the present invention. As shown in FIG. 9, a storage line 213 and a storage pattern 217 are further formed in each pixel region P. The storage line 213 is substantially parallel to the gate line 204. The pixel electrode 260 overlaps the storage line 213 and the storage pattern 217, thereby forming a second storage capacitor StgC2.

Referring to FIGS. 8 and 9, when an electrical short occurs at the crossing portion of one of the first and second gate lines 204a and 204b and the data line 240, a laser cutting process is only performed on the electrical-short-occurred gate line 204a or 204b without a repair patterning forming process. There is rarely an electrical short at both crossing portions between the first gate line 204a and the data line 240 and between the second gate line 204b and the data line 240. Therefore, by electrically isolating the electrical short generated gate line 204a or 204b using a laser beam, a line defect can be overcome.

Hereinafter, a method of fabricating the array substrate according to the second exemplary embodiment of the present invention, and a method of fabricating the array substrate according to other exemplary embodiments will be briefly explained.

FIGS. 10A to 10D are cross-sectional views schematically illustrating a fabricating process of one pixel region of an array substrate in FIG. 5. FIGS. 11A to 11D are cross-sectional views schematically illustrating a fabricating process of a portion taken along the line XI-XI in FIG. 5. FIGS. 12A to 12D are cross-sectional views schematically illustrating a fabricating process of a portion taken along the line XII-XII in FIG. 5. A switching region TrA where the TFT Tr is formed is defined in a pixel region P. Moreover, a repair region RA, where the repair pattern 120 is formed, and a storage region StgA, where the first and second storage capacitors StgC1 and StgC2 are formed, are defined in the substrate 101.

Figure 10A:
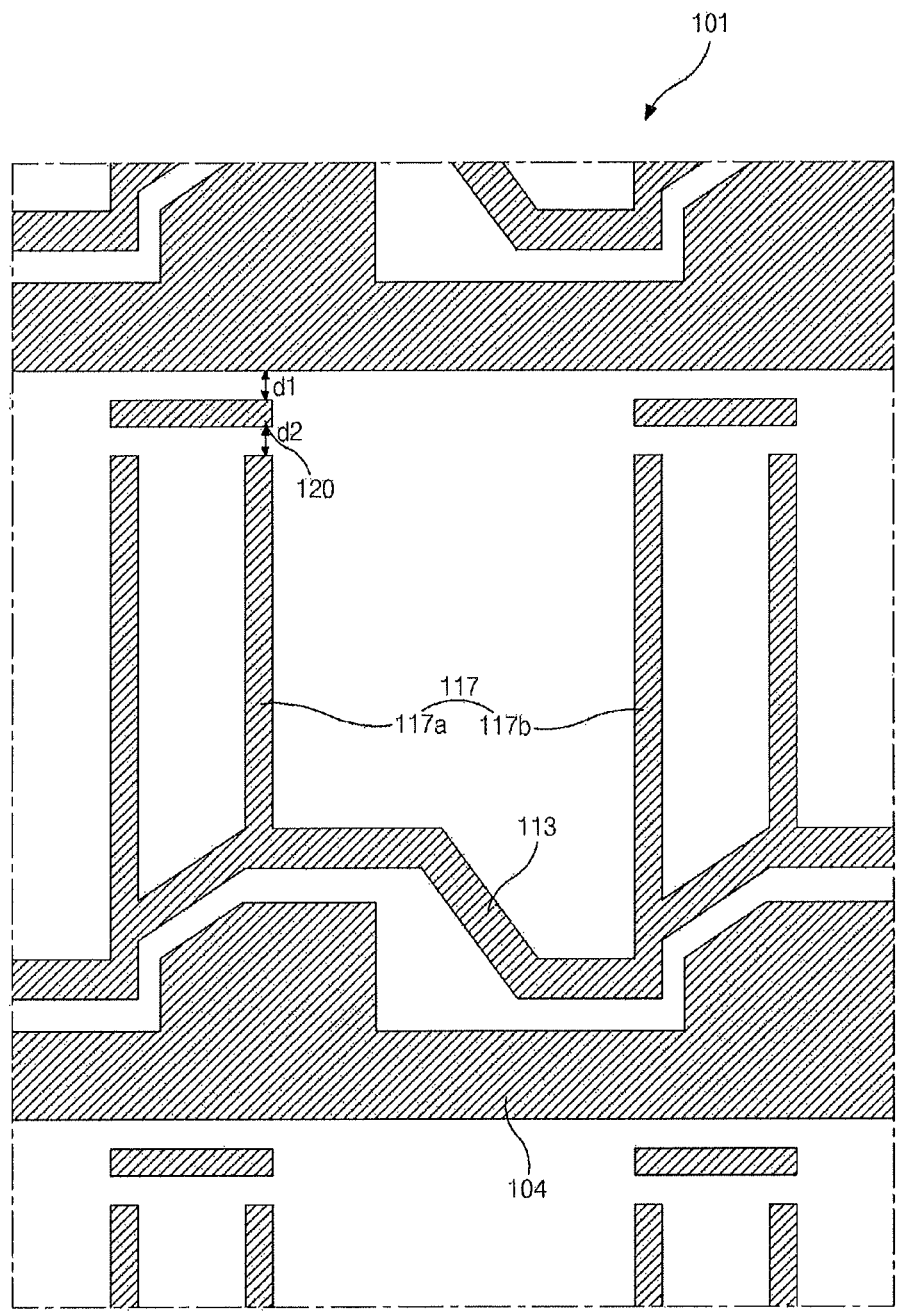
FIGS. 10A to 10D are cross-sectional views showing a fabricating process of one pixel region of an array substrate in FIG. 5.
Figure 11A:
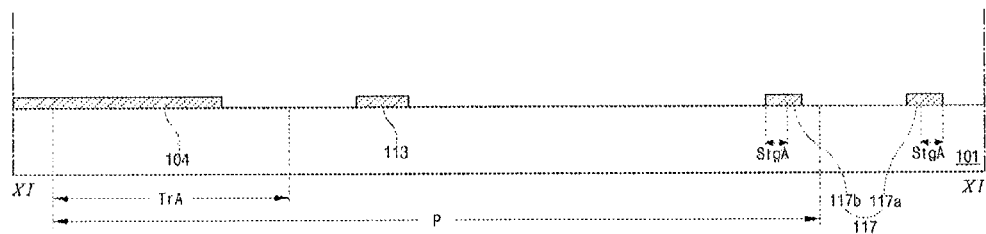
FIGS. 11A to 11D are cross-sectional views showing a fabricating process of a portion taken along the line XI-XI in FIG. 5.
Figure 12A:
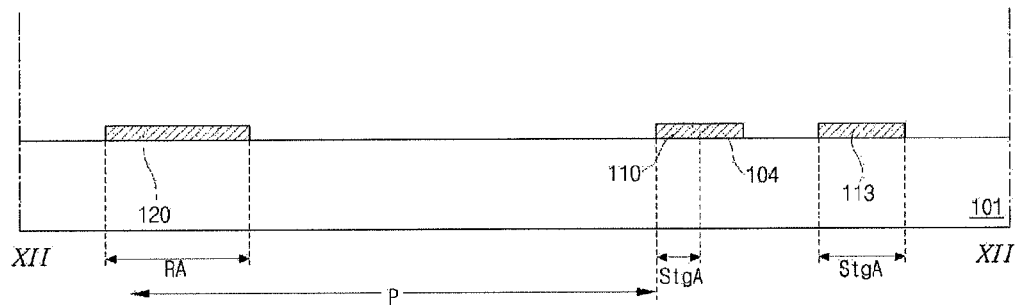
FIGS. 12A to 12D are cross-sectional views showing a fabricating process of a portion taken along the line XII-XII in FIG. 5.

As shown in FIGS. 10A, 11A and 12A, a first metallic material is deposited onto the substrate 101 to form a metallic material layer (not shown). The substrate 101 may be made of a transparent material. The first metallic material layer is patterned by a mask process to form the gate line 104, the gate electrode 107, which is disposed in the switching region TrA and connected to the gate line 104, and the gate pad electrode (not shown) connected to an end of the gate line 104. The mask process includes a step of forming a photoresist (PR) layer on the first metallic material layer, a step of exposing the PR layer using a mask, a step of developing the PR layer to form a PR pattern, a step of etching the first metallic material layer using the PR pattern as an etching mask, and a step of stripping the PR pattern.

At the same time, the repair pattern 120, the storage line 113, and the storage pattern 117 including the first and second storage patterns 117a and 117b are formed on the substrate 101 and of the same material as the gate line 104. The repair pattern 120 is parallel to the gate line 104 and has a bar shape. The storage line 113 is disposed in the pixel region P and substantially parallel to the gate line 104. The first and second storage patterns 117a and 117b extend from ends of the storage line 113. The repair pattern 120 is disposed between the gate line 104 and an end of the storage pattern 117. The repair pattern 120 has a first distance d1 of about 3 micrometers to about 5 micrometers from the gate line 104 and a second distance d2 of about 3 micrometers to about 5 micrometers from the end of the storage pattern 117. The repair pattern 120 has a width being equal to or smaller than a distance between outer lines of the adjacent first and second storage patterns 117a and 117b. The adjacent first and second storage patterns 117a and 117b are disposed at both sides of the data line, which will be formed later.

The storage line and the storage pattern are omitted in the array substrate of the first and third exemplary embodiments. The storage line and the storage pattern are formed in the array substrate of the second and fourth exemplary embodiments. Moreover, the repair pattern is omitted in the array substrate of the third and fourth exemplary embodiments. Instead of the repair pattern, the gate line in the array substrate of the third and fourth exemplary embodiments has a two-way path at a crossing portion of the gate and data lines to overcome a line defect.

Figure 10B:
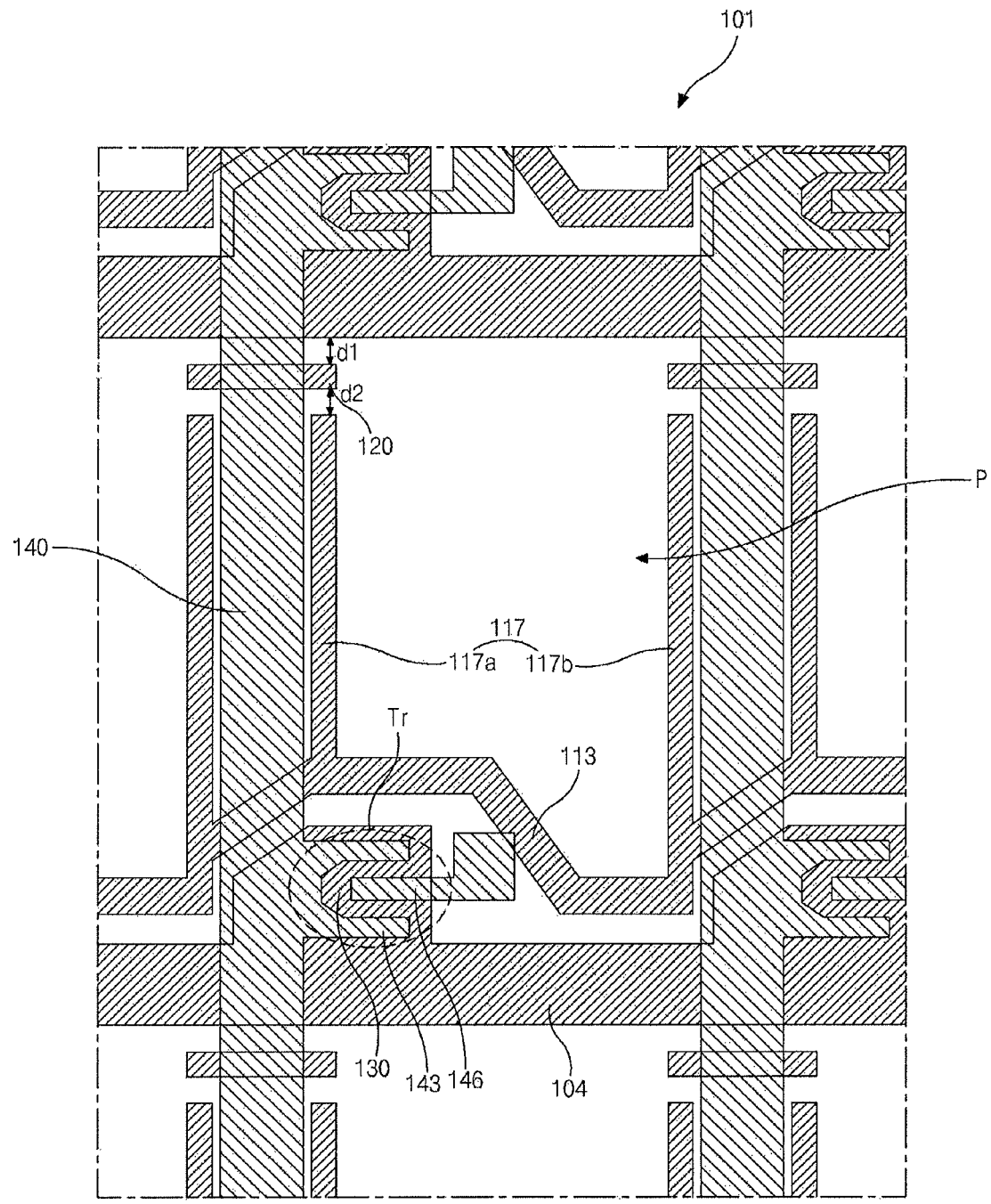
Figure 11B:
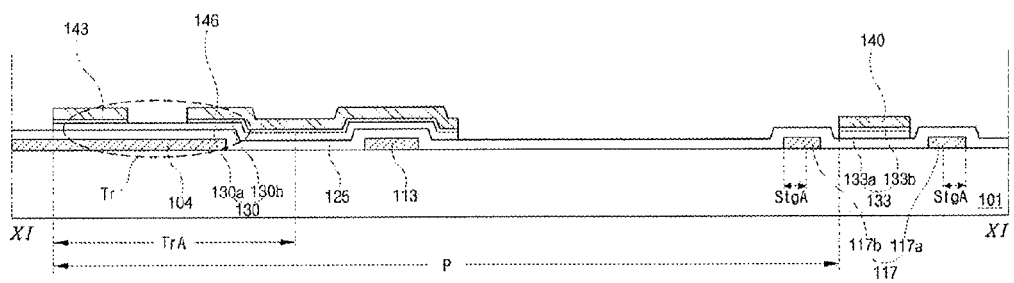
Figure 12B:
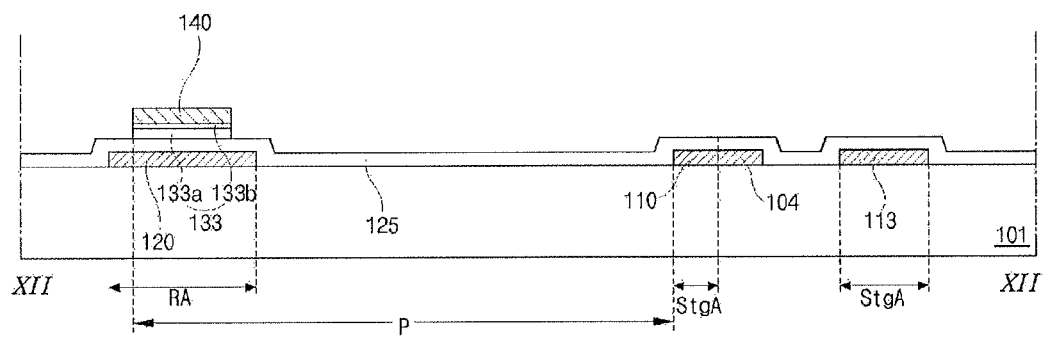

Next, as shown in FIGS. 10B, 11B and 12B, an inorganic insulating material such as silicon oxide ($SiO_2$) and silicon nitride (SiNx) is deposited on an entire surface of the substrate 101, where the gate line, the gate electrode, the repair pattern 120, the storage line 113 and the storage pattern 117 are formed, to form a gate insulating layer 125.

An intrinsic amorphous silicon layer (not shown), an impurity-doped amorphous silicon layer (not shown) and a second metallic material layer (not shown) are sequentially formed on the gate insulating layer 125. The second metallic material layer is patterned by a mask process of a refractive exposure type or a half-tone exposure type to form the active layer 130a of intrinsic amorphous silicon on the gate insulating layer 125 and in the switching region TrA, the ohmic contact layer 130b of impurity-doped amorphous silicon on the active layer 130a, the source electrode 143 on the ohmic contact layer 130b, and the drain electrode 146 on the ohmic contact layer 130b. The source and drain electrodes 143 and 146 are spaced apart from each other. The active layer 130a and the ohmic contact layer 130b may be referred to as the semiconductor layer 130. At the same time, the data line 140 crossing the gate line 104 to define the pixel region P is formed over the gate insulating layer 125. The data line 140 also crosses the repair pattern 120. A semiconductor pattern 133 including first and second patterns 133a and 133b is disposed between the gate insulating layer 125 and the data line 140. However, the semiconductor pattern 133 may be omitted depending on a fabricating process. That is, if the semiconductor layer 130 is formed by one mask process before a second metallic material layer is formed on the semiconductor layer 130 and patterned to form the source and drain electrodes 143 and 146 and the data line 140, the data line 140 is disposed directly on the gate insulating layer 125 without the semiconductor pattern 133. Moreover, the data pad electrode (not shown) is formed at an end of the data line 140 at the same time.

Figure 10C:
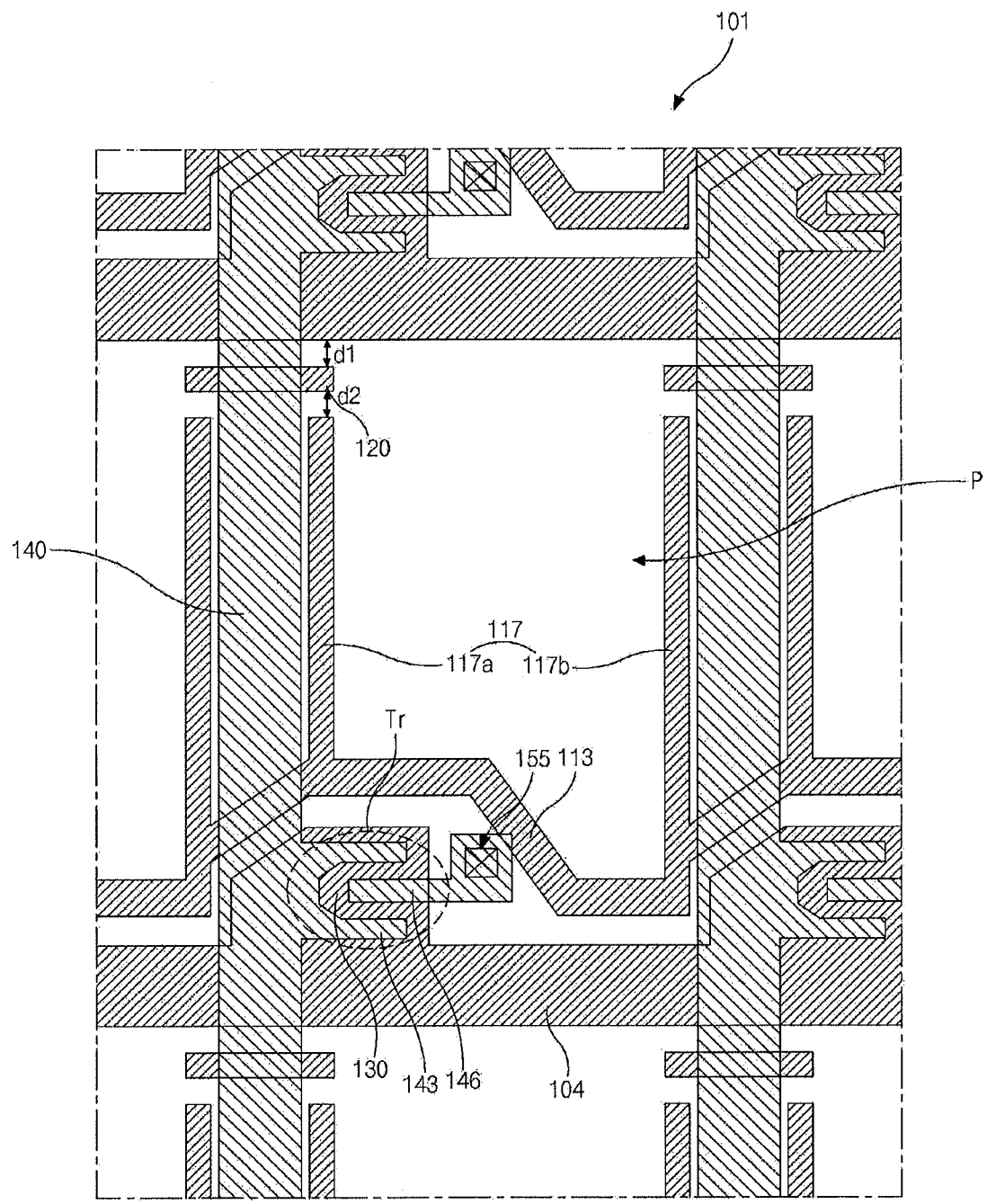
Figure 11C:
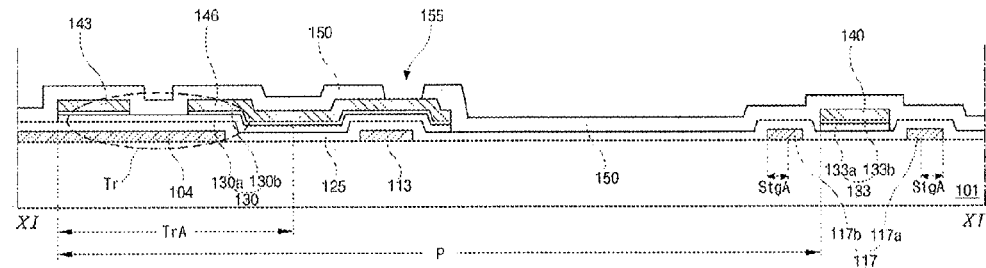
Figure 12C:
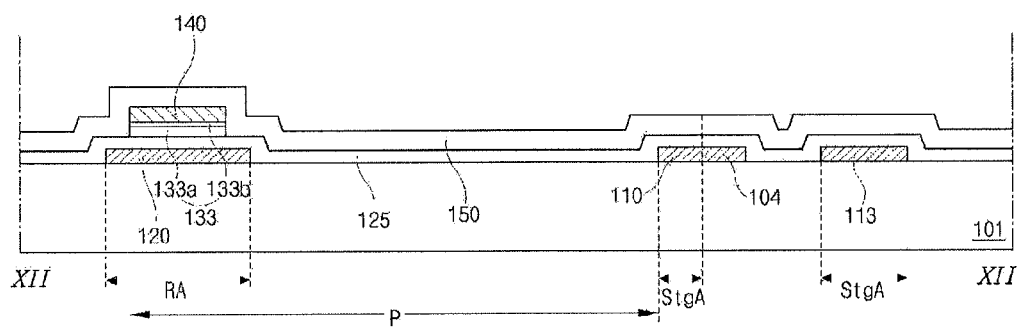

Next, as shown in FIGS. 10C, 11C and 12C, an inorganic insulating material is deposited on an entire surface of the substrate 101, where the data line 140, the source electrode 143 and the drain electrode 146 are formed, thereby forming the passivation layer 150. The passivation layer 150 is patterned by a mask process to form the drain contact hole 155, the gate pad contact hole (not shown) and the data pad contact hole (not shown). The drain contact hole 155 exposes a portion of the drain electrode 146, and the data pad contact hole exposes the data pad electrode. The gate pad contact hole exposes the gate pad electrode through the gate insulating layer 125. To form the gate pad contact hole, not only the passivation layer 150 but also the gate insulating layer 125 are patterned by the mask process.

Figure 10D:
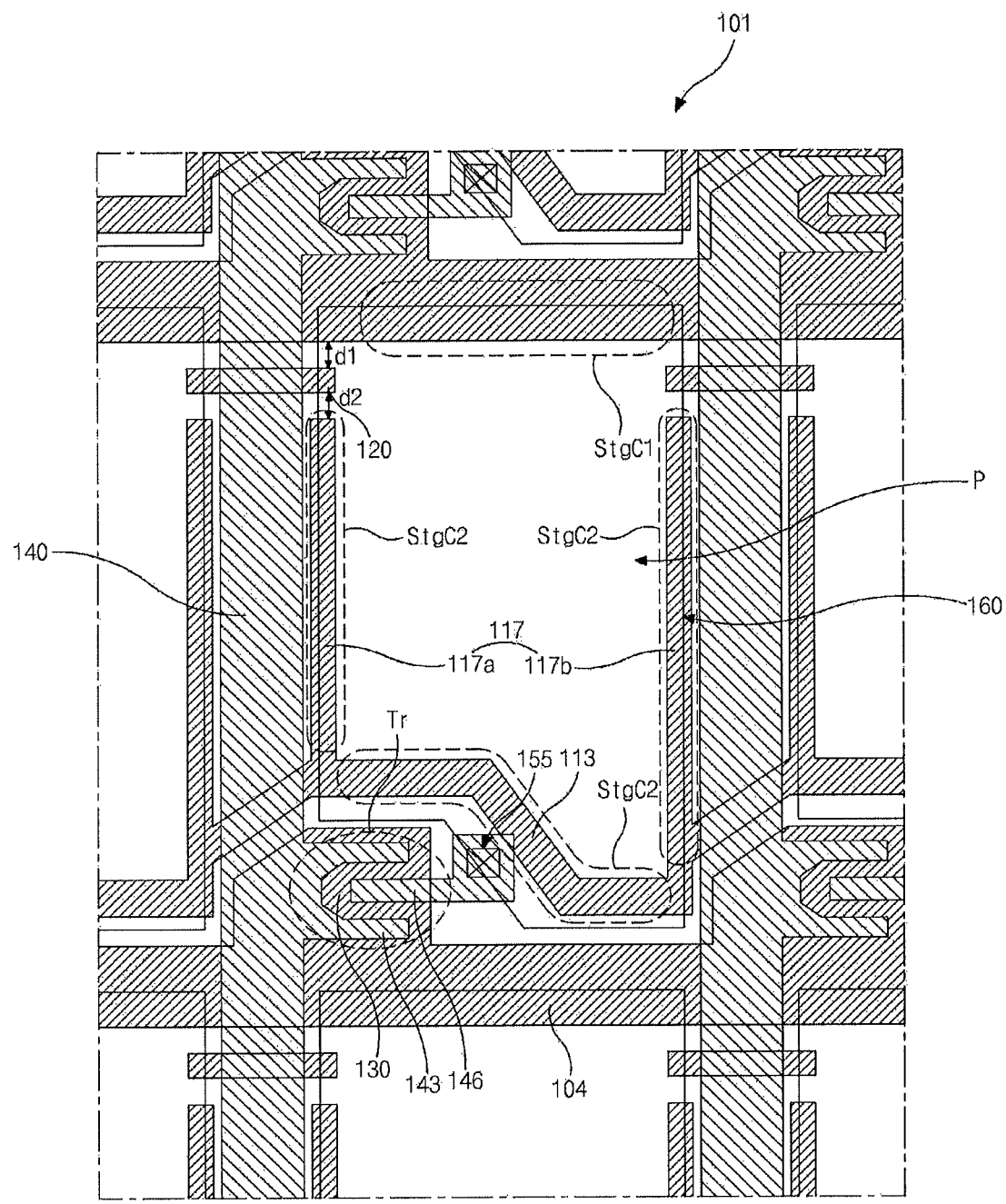
Figure 11D:
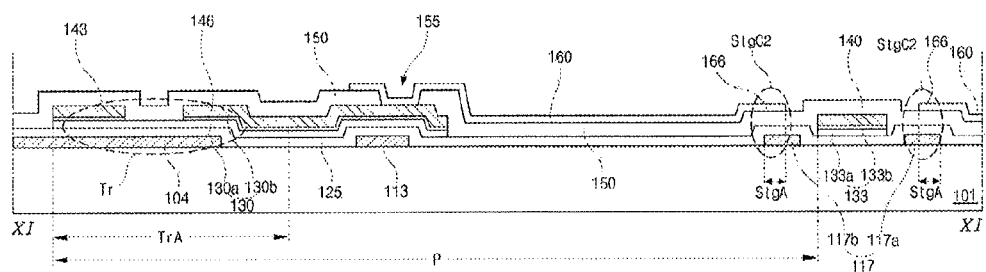
Figure 12D:
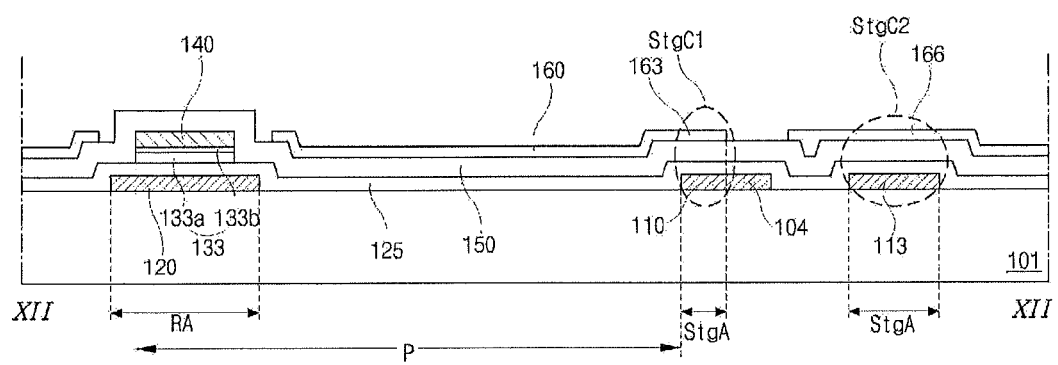

Next, as shown in FIGS. 10D, 11D and 12D, a transparent conductive material, for example, indium-tin-oxide (ITO) or indium-zinc-oxide (IZO), is deposited on the passivation layer 150, where the drain contact hole 155, the gate pad contact hole and the data pad contact hole are formed, thereby forming a transparent conductive material layer (not shown). The transparent conductive material layer is patterned by a mask process to form the pixel electrode 160 in each pixel region P. The pixel electrode 160 contacts the drain electrode 146 through the drain contact hole 155. The pixel electrode 160 overlaps each of the previous gate line 104, the storage line 113 and the storage pattern 117. An overlapped portion of the previous gate line 104 and the pixel electrode 160 form the first storage capacitor StgC1 in the storage region StgA, and overlapped portions between the storage line 113 and the pixel electrode 160 and between the storage pattern 117 and the pixel electrode 160 form the second storage capacitor StgC2 in the storage region StgA. In the first storage capacitor StgC1, an overlapped portion of the previous gate line 104 serves as a first storage electrode 110, an overlapped portion of the pixel electrode 160 serves as a second storage electrode 163, and the gate insulating layer 125 and the passivation layer 150 between the first and second storage electrodes 110 and 163 serves as a dielectric material layer. In the second storage capacitor StgC2, overlapped portions of the storage line 113 and the storage pattern 117 serve as a third storage electrode, an overlapped portion of the pixel electrode 160 serves as a fourth storage electrode 166, and the gate insulating layer 125 and the passivation layer 150 between the third storage electrode and the fourth storage electrode 116 serve as a dielectric material layer. Since the storage line and the storage pattern are not formed in the array substrate according to the first and third exemplary embodiments, there is no second storage capacitor.

Figure 13:
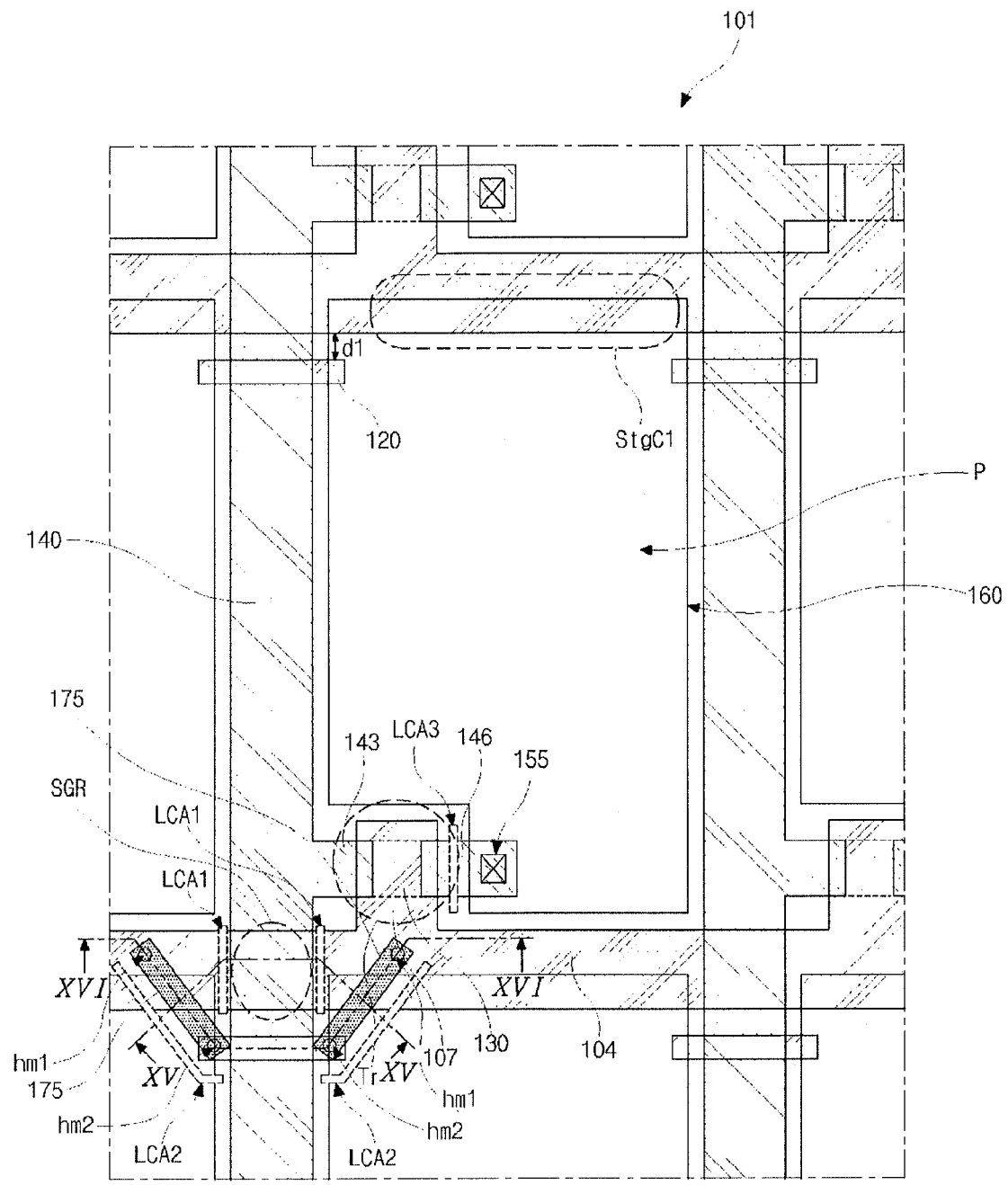
FIG. 13 is a plan view showing a portion of an array substrate after a repairing process according to a fifth exemplary embodiment of the present invention.

FIG. 13 is a plan view schematically illustrating a portion of an array substrate after a repairing process according to a fifth exemplary embodiment of the present invention. FIGS. 14A to 14D are plan views schematically illustrating a repairing process on an array substrate in FIG. 13. FIGS. 15A to 15D are cross-sectional views schematically illustrating a repairing process of a portion taken along the line XV-XV in FIG. 13. FIGS. 16A to 16D are cross-sectional views schematically illustrating a repairing process of a portion taken along the line XVI-XVI in FIG. 13. Referring to FIGS. 13 to 16D, a repairing process for the array substrate according to the present invention is explained below.

FIG. 13 illustrates an electrical short generated at a crossing portion (overlapped portion) of the gate line 104 and the data line 140. The overlapped portion where the electrical short occurs is defined as a short generating region SGR. A laser beam is irradiated onto the gate line 104 to form a first laser beam irradiating area LCA1 at both sides of the short generating region SGR. The gate line 140 at both sides of the short generating region SGR is thus electrically disconnected from the short generating region SGR by the laser beam irradiation. First grooves hm1 are formed on the gate line 104 and second grooves hm2 are formed on the repair pattern 120. The first grooves hm1 are disposed at an outer side of the first laser beam irradiating area LCA1. That is, the first laser beam irradiating areas LCA1 are disposed between the short generating region SGR and each of the first grooves hm1. The second grooves hm2 are disposed at both ends of the repair pattern 120. The first and second grooves hm1 and hm2 expose the gate line 104 and the repair pattern 120, respectively.

A first contact pattern 173 (of FIG. 16C) contacting the gate line 104 and a second contact pattern 174 (of FIG. 16C) contacting the repair pattern 120 are formed in the first and second grooves hm1 and hm2, respectively. That is, the first and second grooves hm1 and hm2 are filled with the first and second contact patterns 173 and 174. A connection pattern 175 contacting the first and second contact patterns 173 and 174 are formed such that the gate line 104 is electrically connected to the repair pattern 120 through the connection pattern 175.

In the above array substrate, when an electrical short is generated at a crossing portion (overlapped portion) of the gate and data lines 104 and 140, the gate line 104 connected to the overlapped portion where the electrical short occurs is electrically disconnected. Next, portions of the gate line 104 at both sides of the crossing portion, where the electrical short occurs, are electrically connected to each other through the connection pattern 175, thereby overcoming a line defect resulted from the electrical short. The connection pattern 175 may be formed directly on the pixel electrode 160. Accordingly, to prevent an electrical short between the gate line 104 and the pixel electrode 160 through the connection pattern 175, the pixel electrode 160 overlapping the corresponding repair pattern 120 and the gate line 104 overlapping the corresponding pixel electrode 160 are cut along a perimeter of the repair pattern 120 and the connection pattern 175 using a laser beam before forming the connection pattern 175. Since a portion, where the connection pattern 175 is formed, of the pixel electrode 160 is electrically disconnected to the other portion of the pixel electrode 160, there is no electrical short between the gate line 104 and the pixel electrode 160. The laser beam irradiated area of the pixel electrode 160 is referred to as a second laser beam irradiating area LCA2.

Moreover, a laser beam is also irradiated onto a third laser beam irradiating area LCA3 formed in the drain electrode 146 of the TFT Tr, which is connected to the electrical short generated at the crossing portion of the gate and data lines 104 and 140. Thus, the TFT Tr is disconnected from the pixel electrode 160. Accordingly, the pixel electrode 160 in the pixel region P, which is defined by the corresponding gate and data lines 104 and 140, does not receive an image signal such that the corresponding pixel region P has a black-colored state. As a result, the line defect, which results from the electrical short between the gate and data lines 104 and 140, is thus changed into a dot defect.

In more detail, in four pixel regions P arranged in a matrix shape, when an electrical short is generated at the crossing portion of the gate and data lines 104 and 140, a second pixel region P at a first row and a second column is processed to become a black-colored pixel region. Each of the gate and data lines 104 and 140 is disposed across the matrix shape. A repair process is performed using the repair pattern 120 disposed over the third pixel region at a second row and a first column and a fourth pixel region at the second row and the second column. The drain electrode 146 in the second pixel region P is cut.

Figure 14A:
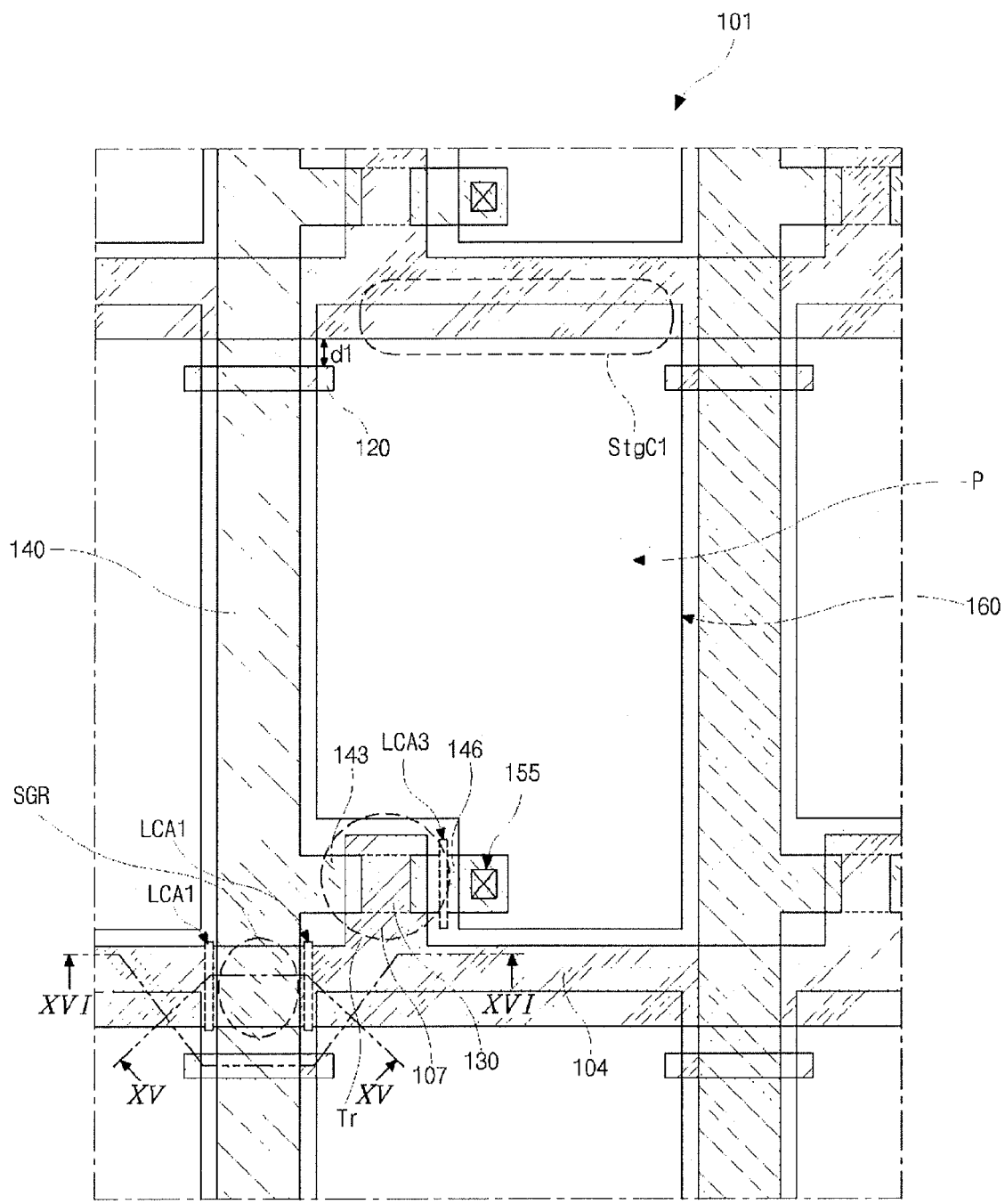
FIGS. 14A to 14D are plan views showing a repairing process on an array substrate in FIG. 13.
Figure 15A:
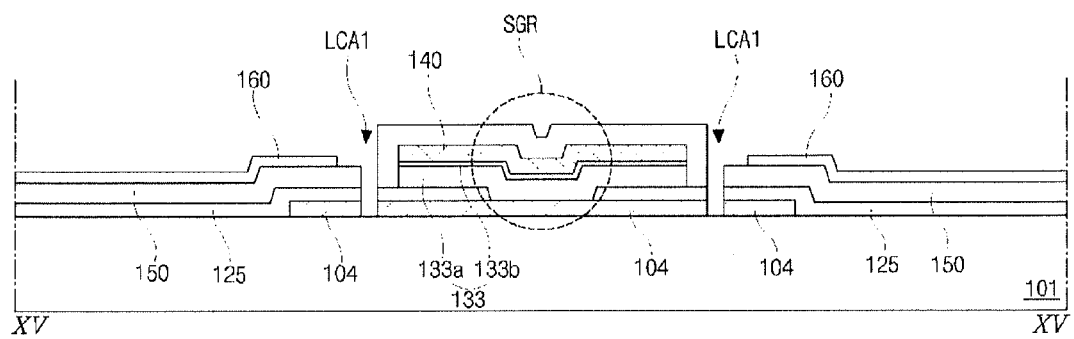
FIGS. 15A to 15D are cross-sectional views showing a repairing process of a portion taken along the line XV-XV in FIG. 13.
Figure 16A:
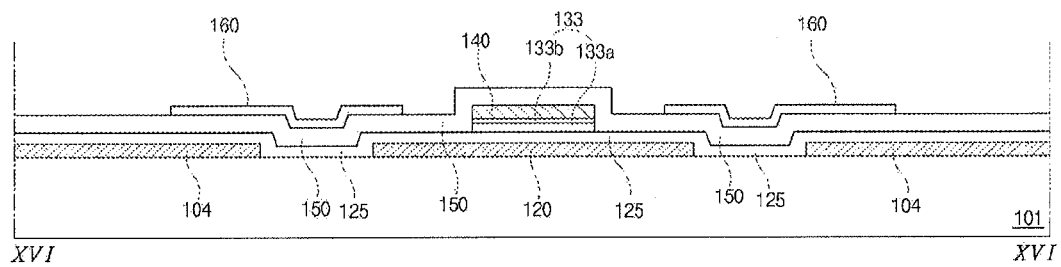
FIGS. 16A to 16D are cross-sectional views showing a repairing process of a portion taken along the line XVI-XVI in FIG. 13.

Referring to FIGS. 14A, 15A and 16A, in the substrate 101, an electrical short is generated at a crossing portion (overlapped portion) SGR between the gate line 104 and the data line 140. The gate line 104 includes two cutting areas, which are the first laser beam irradiating areas LCA1 positioned outside the overlapped portion of the gate and data lines 104 and 140. The gate line 104 is cut by irradiating a laser beam onto the first laser beam irradiating areas LCA1 using a laser beam irradiating unit. Thus, the short generating region SGR is electrically isolated from the gate line 104. At the same time, the drain electrode 146 includes a cutting area, which is the third laser beam irradiating area LCA3. The drain electrode 146 is cut by irradiating a laser beam onto the third laser beam irradiating area LCA3 so that the pixel electrode 160 is electrically disconnected from the TFT Tr.

Figure 14B:
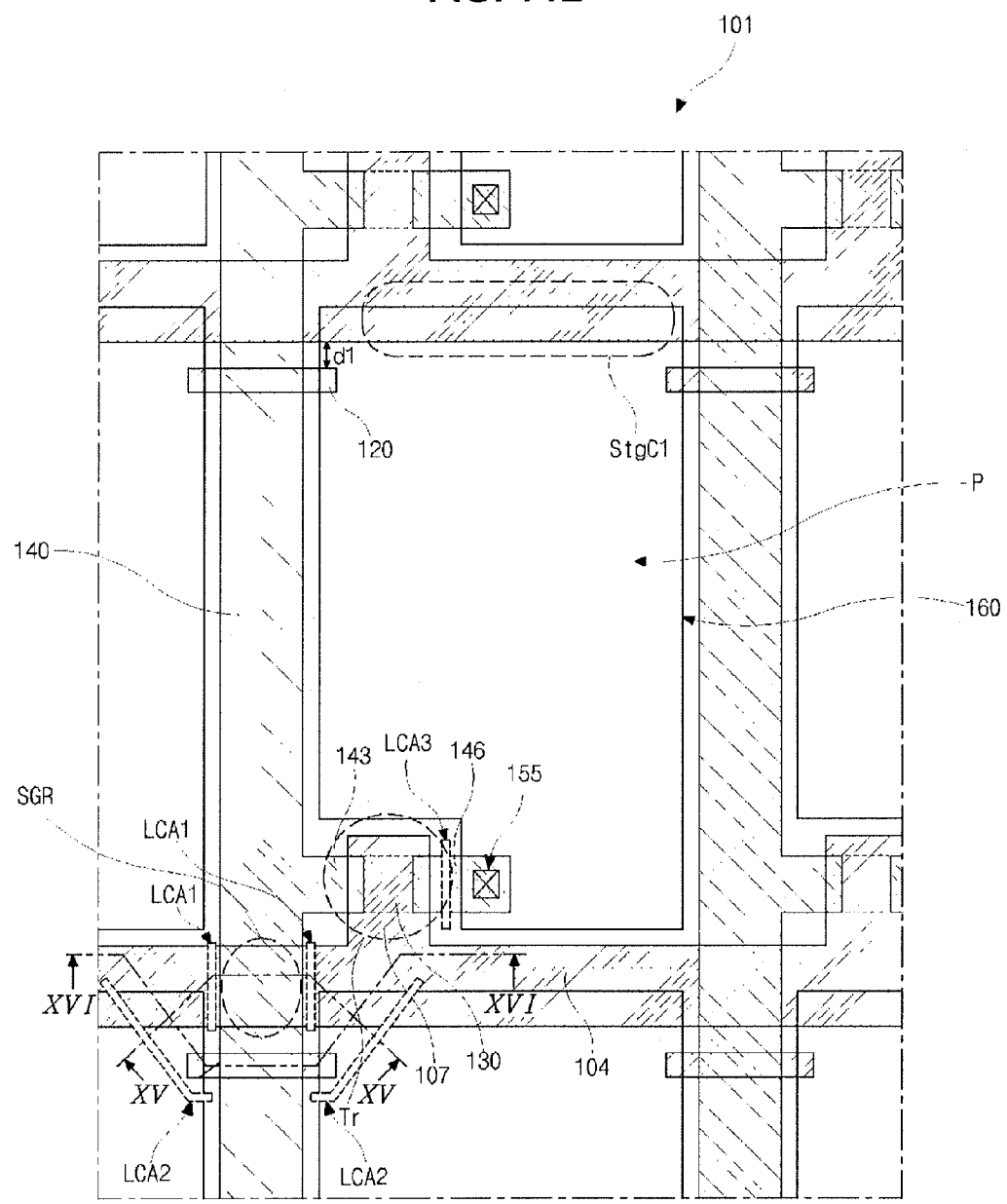
Figure 15B:
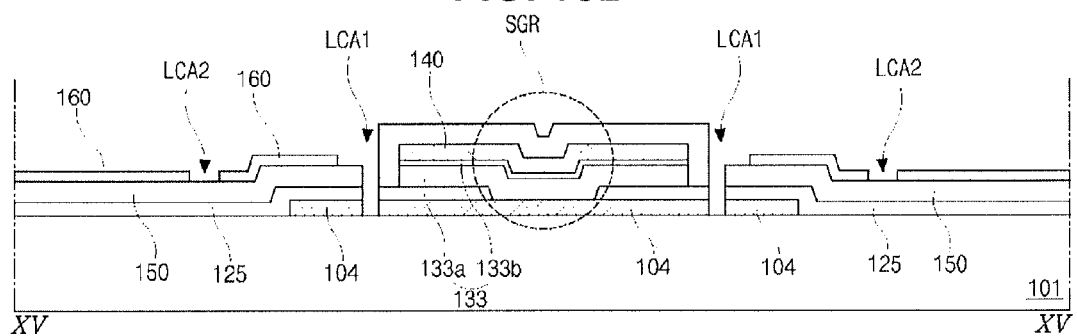
Figure 16B:
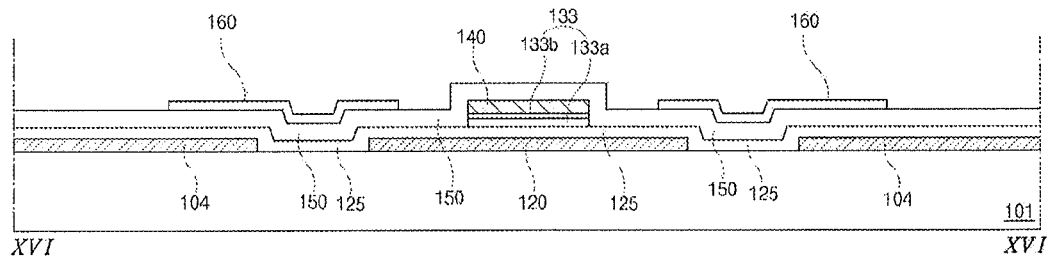

Next, as shown in FIGS. 14B, 15B and 16B, the pixel electrode 160 overlapping the corresponding repair pattern 120 and the gate line 104 overlapping the corresponding pixel electrode 160 are cut along a perimeter of the repair pattern 120 and the connection pattern, which will be formed, by irradiating a laser beam onto the second laser beam irradiating area LCA2 such that one portion of the pixel electrode 160 is electrically disconnected from the other portion of the pixel electrode 160.

Figure 14C:
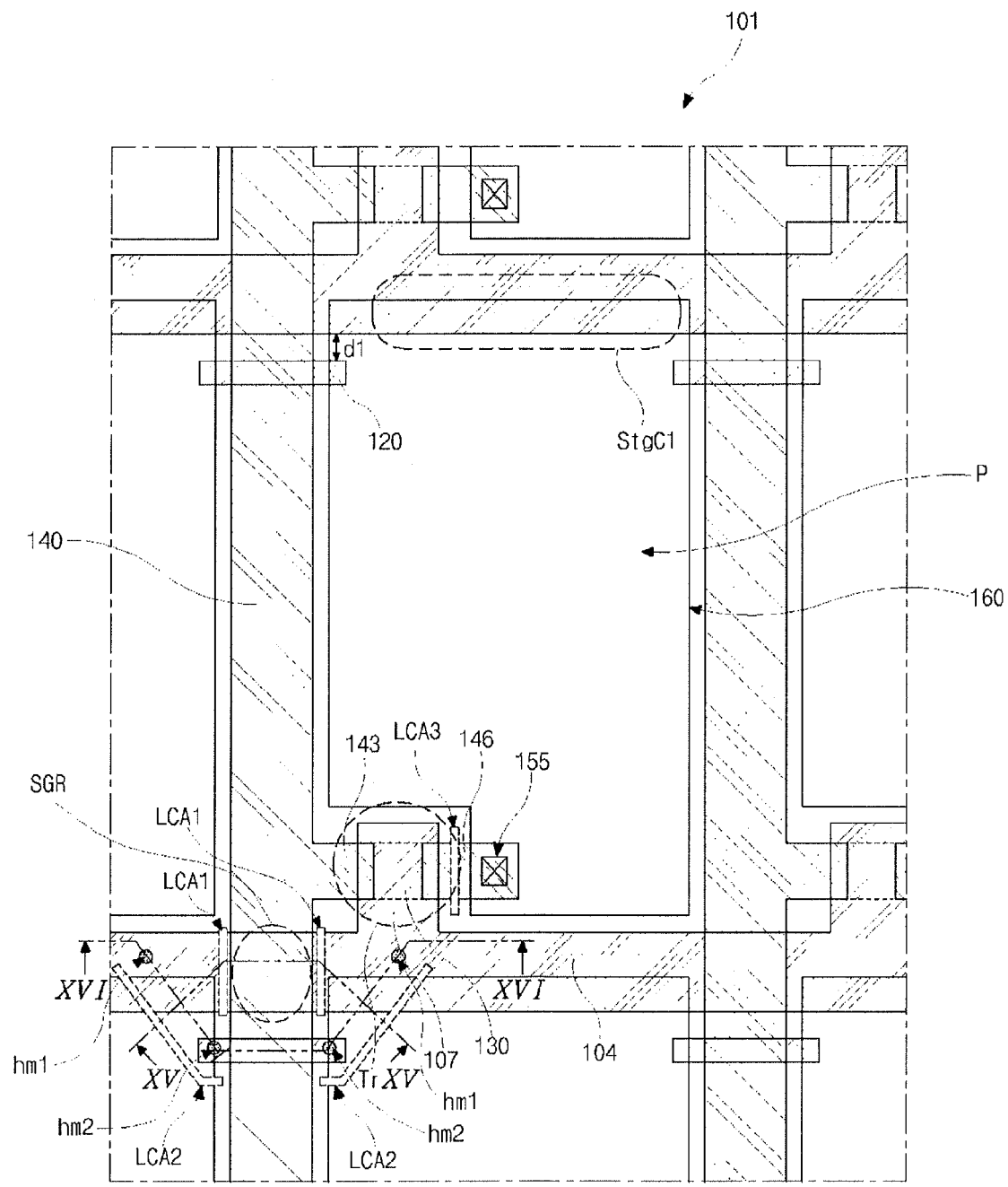
Figure 15C:
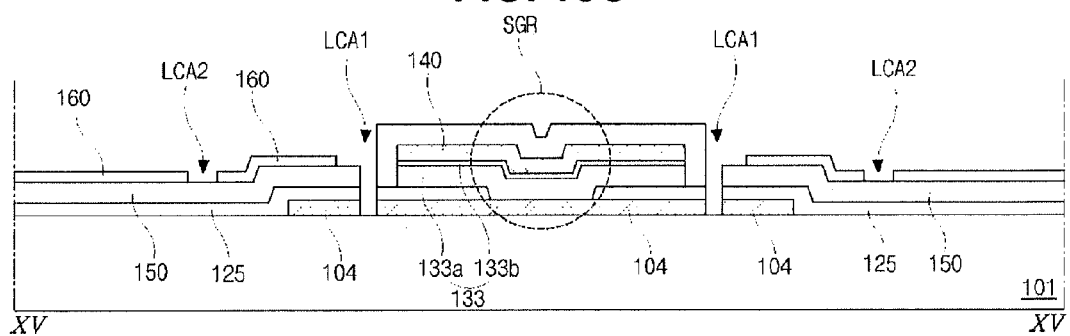
Figure 16C:
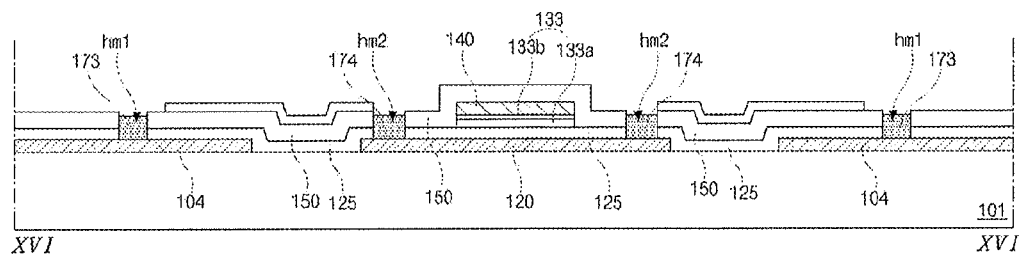

Next, as shown in FIGS. 14C, 15C and 16C, the first and second grooves hm1 and hm2 are formed on the gate line 104 and the repair pattern 120, respectively, by irradiating a laser beam. The first grooves hm1 are disposed at an outer side of the first laser beam irradiating area LCA1. That is, the first laser beam irradiating areas LCA1 are disposed between the short generating region SGR and each of the first grooves hm1. The second grooves hm2 are disposed at both ends of the repair pattern 120. The first and second grooves hm1 and hm2 expose the gate line 104 and the repair pattern 120, respectively. The laser beam for forming the first and second grooves hm1 and hm2 is different from the laser beam for cutting the gate line 104, with respect to a fact, for example, a source for generating the laser beam, a pocus, a power or an irradiating duration time. By controlling the fact, only an inorganic insulating material layer or both an inorganic insulating layer and an organic insulating layer is removed. Accordingly, by desirably controlling the fact, the first grooves hm1 exposing the gate line 104 and the second grooves hm2 exposing the repair pattern 120 are thus formed.

After that, by using a chemical vapor depositing (CVD) repair apparatus (not shown) using a laser beam, the first contact pattern 173 corresponding to the first grooves hm1 and the second contact pattern 174 corresponding to the second grooves hm2 are formed. The first and second grooves hm1 and hm2 are filled with the first and second contact patterns 173 and 174, respectively.

Figure 14D:
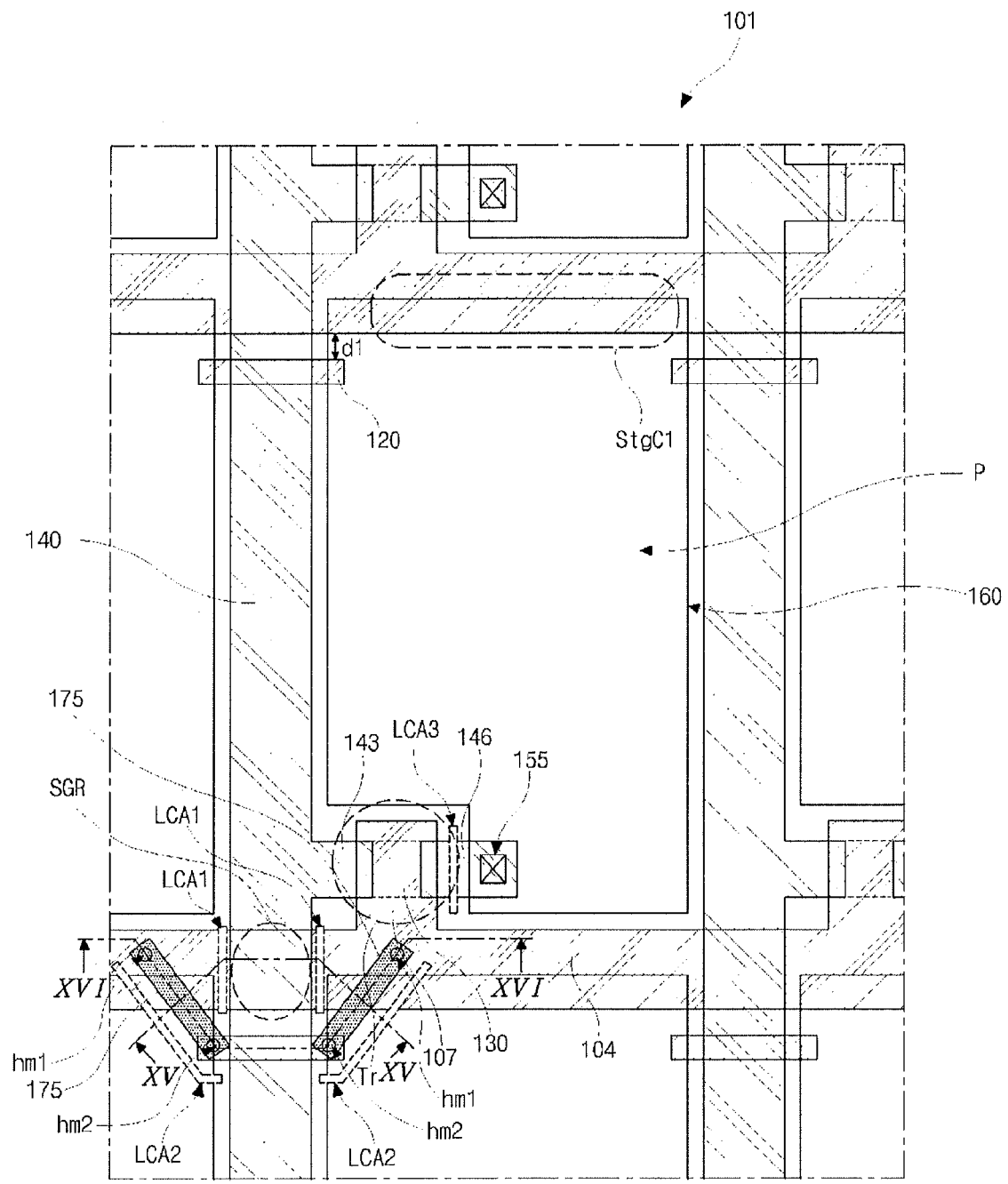
Figure 15D:
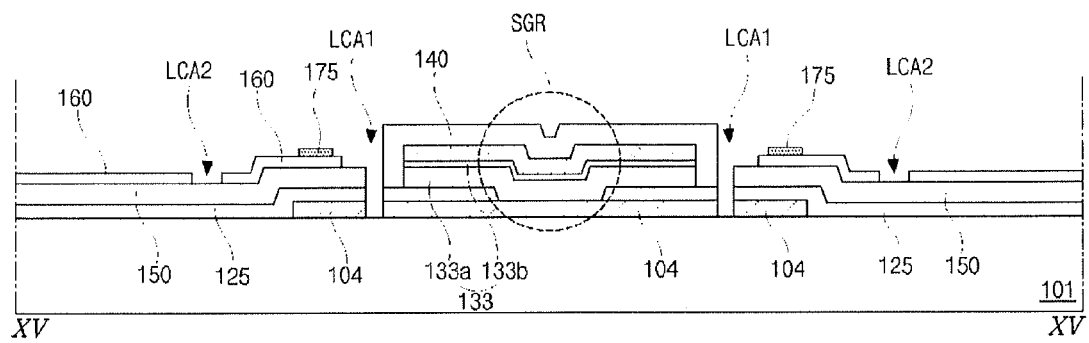
Figure 16D:
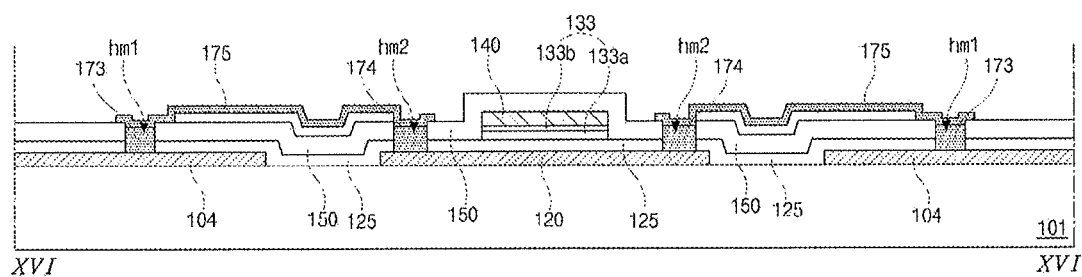

Next, as shown in FIGS. 14D, 15D and 16D, the connection pattern 175 connecting the first contact pattern 173 at the gate line 104 and the second contact pattern 174 at the repair pattern 120 are formed on the pixel electrode 160 by the CVD repair apparatus. The connection pattern 175 contacts both the first and second contact patterns 173 and 174. By irradiating a laser beam from the CVD repair apparatus onto the substrate 101 under a gas condition between the CVD repair apparatus and the substrate 101, the gas reacts with the laser beam such that an optical decomposition is generated in the gas. As a result, the optical decomposed gas is deposited onto a portion, where the laser beam is irradiated, of the substrate 101 such that each of the connection pattern 175 and the first and second contact patterns 173 and 174 is formed. For example, the gas may be $W(CO)_6$, and the connection pattern 175 is formed of a tungsten-based material. Although the first and second contact patterns 173 and 174 are formed by a different step from the connection pattern 175, the first and second contact patterns 173 and 174 and the connection pattern 175 may be formed by the same step.

The laser beam irradiating process should be exactly controlled to form desired patterns by the CVD repair apparatus. Since an irradiating duration time of the laser beam is very short, the connection pattern 175 by the CVD repair apparatus has a relatively small thickness such that a surface condition, particularly a step difference, where the connection pattern 175 is formed is very important. If the connection pattern 175 is formed over the gate line 104 or the data line 140, there may be a discontinuation in the connection pattern 175 such that another defect is generated. Accordingly, the portions of the gate line 104 at both sides of the short generating region SGR is electrically connected through a roundabout way of the repair pattern 120 on the same layer and of the same material as the gate line 104.

Figure 17:
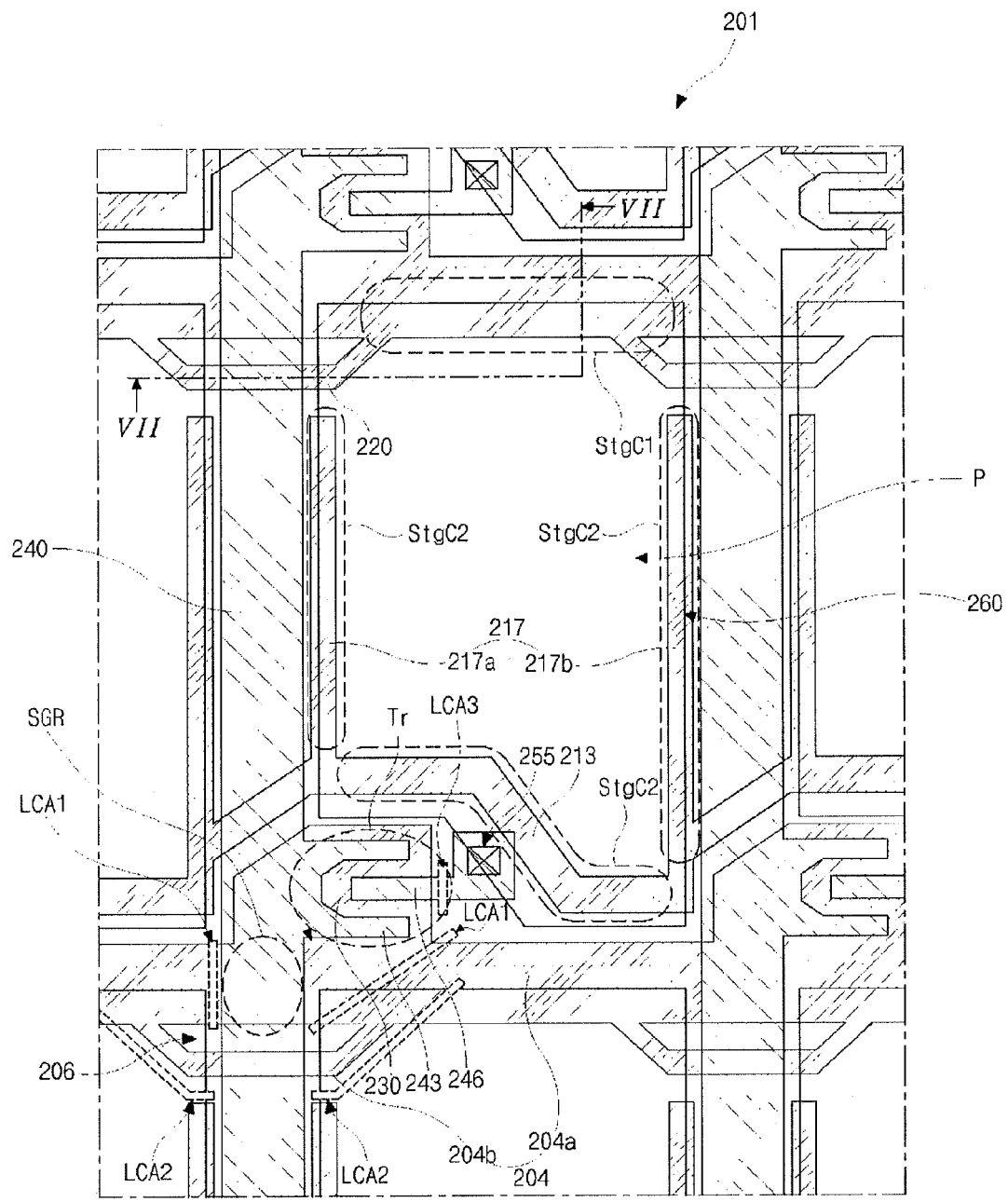
FIG. 17 is a plan view schematically illustrating a portion of an array substrate after a repairing process according to a sixth embodiment of the present invention.

On the other hand, as shown in FIG. 17, which is a plan view schematically illustrating a portion of an array substrate after a repairing process according to a sixth exemplary embodiment of the present invention, an electrical short is generated at a crossing portion of the first gate line 204a and the data line 240. The portion where the electrical short is generated is defined as a short generating region SGR. As explained in the third and fourth exemplary embodiments, the gate line 204 includes first and second gate lines 204a and 204b. The gate line 204 has a two-way path at the crossing portion of the gate and data lines 204 and 240. The channel of the TFT has a "U" shape.

In this case, each of the first and second gate lines 204a and 204b crosses the data line 240. Accordingly, in order to repair the electrical short problem, only disconnection or cut processes are performed without a CVD repair process using a laser beam. The disconnection processes for the gate line 204 and the drain electrode 246 may be same as the above processes explained in FIGS. 14A and 14B.

In the present invention, when an electrical short is generated at a crossing portion of a gate line and a data line, the electrical short problem can be overcome by changing a line defect into a dot defect through the above-explained exemplary repair processes. As a result, a production yield is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed:

1. A method of repairing an array substrate having a defect for a liquid crystal display device, comprising:
    forming a gate line including first and second gate lines on a substrate, wherein the second gate lines is branched from the first gate line to form a two-way path structure for the gate line;
    forming a data line crossing the gate line to form a crossing portion, thereby defining first to fourth pixel regions arranged in a matrix shape;
    forming a thin film transistor in the second pixel region and connected to the gate and date lines;
    forming a pixel electrode in the second pixel region and connected to the thin film transistor; and
    irradiating a laser beam onto the crossing portion of the gate and data lines such that the data line is electrically disconnected from the first gate line, and the pixel electrode is electrically disconnected from the thin film transistor, respectively, when an electrical short is generated at an overlapped portion of the gate and data lines.

2. The method according to claim 1, wherein the step of forming the gate line includes:
    forming a storage line formed on the first substrate that are parallel to and spaced apart from the first gate line; and
    forming a storage pattern including a first storage pattern and a second storage pattern in each pixel region such that the first storage pattern extends from one end of the storage line to be parallel to a left side the data line, and the second storage pattern extends from the other end of the storage line to be parallel to a right side of the data line;

wherein the second gate line is disposed between the first gate line and each end of the first and second storage patterns.

3. The method according to claim 1, wherein the two-way path created by the first and second gate lines has a distance in a range of about 3 to 5 micrometers.

4. The method according to claim 1, wherein the second gate line has two contact portions with the first gate line, and the data line is positioned between two contact portions.

5. The method according to claim 1, wherein the step of irradiating the laser beam includes:

irradiating a first laser beam onto a first portion of the first gate line at a first side of the crossing portion of the first gate line and the data line;

irradiating a second laser beam onto a second portion of the first gate line at a second side of the crossing portion of the first gate line and the data line; and irradiating a third laser beam onto a drain electrode of the thin film transistor.

6. The method according to claim 5, wherein the first portion of the first gate line is positioned between the a first contact portion of the first and second gate lines and the crossing portion of the first gate line and the data line, and the second portion is positioned between the a second contact portion of the first and second gate lines and the crossing portion of the first gate line and the data line.

7. The method according to claim 1, wherein the thin film transistor includes a source electrode connected to the data line and a drain electrode connected to the pixel electrode, and the source and drain electrodes are spaced apart from each other.

* * * * *